United States Patent
Shirota et al.

(10) Patent No.: US 12,277,962 B2
(45) Date of Patent: Apr. 15, 2025

(54) MEMORY DEVICE USING SEMICONDUCTOR ELEMENT

(71) Applicant: Unisantis Electronics Singapore Pte. Ltd., Singapore (SG)

(72) Inventors: Riichiro Shirota, Hsinchu (TW); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 322 days.

(21) Appl. No.: 18/077,895

(22) Filed: Dec. 8, 2022

(65) Prior Publication Data
US 2023/0186966 A1    Jun. 15, 2023

(30) Foreign Application Priority Data
Dec. 14, 2021   (WO) .................. PCT/JP2021/045965

(51) Int. Cl.
*G11C 11/404* (2006.01)
*G11C 11/406* (2006.01)
(Continued)

(52) U.S. Cl.
CPC .......... *G11C 11/404* (2013.01); *G11C 11/406* (2013.01); *G11C 11/4096* (2013.01);
(Continued)

(58) Field of Classification Search
CPC . G11C 11/404; G11C 11/406; G11C 11/4096; G11C 16/10; G11C 16/16;
(Continued)

(56) References Cited

U.S. PATENT DOCUMENTS 9,361,981 B2 * 6/2016 El-Kareh ........... G11C 16/0408
10,074,438 B2 * 9/2018 Givant ................. H10D 30/696
(Continued)

FOREIGN PATENT DOCUMENTS

JP    H 02-188966 A    7/1990
JP    H 03-171768 A    7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).
(Continued)

*Primary Examiner* — Amir Zarabian
*Assistant Examiner* — Justin Bryce Heisterkamp
(74) *Attorney, Agent, or Firm* — Crowell & Moring LLP

(57) ABSTRACT

A memory device includes pages each composed of memory cells arrayed in columns on a substrate. A page write operation of retaining a hole group formed by impact ionization inside a channel semiconductor layer, and a page erase operation of discharging the hole group from the channel semiconductor layer are performed. A first impurity layer is connected to a source line, a second impurity layer to a bit line, a first gate conductor layer to a first selection gate line, a second gate conductor layer to a plate line, a third gate conductor layer to a second selection gate line, and a bit line to a sense amplifier circuit. Page data of a memory cell group selected in at least one page is read to the bit line. Zero volts or less is applied to the plate line of the memory cell connected to an unselected page.

12 Claims, 24 Drawing Sheets

(51) Int. Cl.
| | |
|---|---|
| *G11C 11/4096* | (2006.01) |
| *G11C 16/02* | (2006.01) |
| *G11C 16/10* | (2006.01) |
| *G11C 16/16* | (2006.01) |
| *G11C 16/24* | (2006.01) |
| *G11C 16/26* | (2006.01) |
| *H10B 12/00* | (2023.01) |
| *H10B 99/00* | (2023.01) |
| *H10B 43/27* | (2023.01) |
| *H10D 30/69* | (2025.01) |

(52) U.S. Cl.
CPC .............. *G11C 16/02* (2013.01); *G11C 16/10* (2013.01); *G11C 16/16* (2013.01); *G11C 16/24* (2013.01); *G11C 16/26* (2013.01); *H10B 12/20* (2023.02); *H10B 99/22* (2023.02); *H10B 43/27* (2023.02); *H10D 30/693* (2025.01)

(58) Field of Classification Search
CPC ......... G11C 16/24; G11C 16/26; G11C 16/02; H10B 12/20; H10B 99/22; H10B 43/27; H01L 29/7926
See application file for complete search history.

(56) References Cited

U.S. PATENT DOCUMENTS

| | | | |
|---|---|---|---|
| 2003/0111681 | A1 | 7/2003 | Kawanaka |
| 2004/0240273 | A1* | 12/2004 | Sakui .................. G11C 16/16 365/185.33 |
| 2006/0049444 | A1 | 3/2006 | Shino |
| 2008/0137394 | A1 | 6/2008 | Shimano et al. |
| 2008/0212366 | A1 | 9/2008 | Ohsawa |
| 2012/0092925 | A1* | 4/2012 | Chen ................... H10D 30/711 365/182 |
| 2023/0145678 | A1* | 5/2023 | Shirota ................ H10B 12/33 365/129 |
| 2023/0324522 | A1* | 10/2023 | Henderson ........... G01S 7/4865 356/5.01 |

FOREIGN PATENT DOCUMENTS

| | | |
|---|---|---|
| JP | 2006-080280 A | 3/2006 |
| JP | 3957774 B2 | 5/2007 |
| JP | 2008-218556 A | 9/2008 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, Dec., pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng, Y. He, G. Du, X. Liu and X. Zhang: "Experimental investigation of self heating effect (SHE) in multiple-fin SOI F inFETs," Semicond. Sci. Technol. 29 (2014) 115021 (7pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

Takashi Ohsawa: "SOI DRAM using single FET cell", Applied Physics, vol. 75, No. 9, pp. 1131-1135, 2006.

International Search Report (PCT/ISA/210) (Japanese) from PCT/JP2021/045965 dated Jan. 25, 2022, 3 pgs.

International Written Opinion (PCT/ISA/237) (Japanese) from PCT/JP2021/045965 dated Jan. 25, 2022, 3 pgs.

\* cited by examiner

FIG. 4AA  "1" WRITTEN STATE
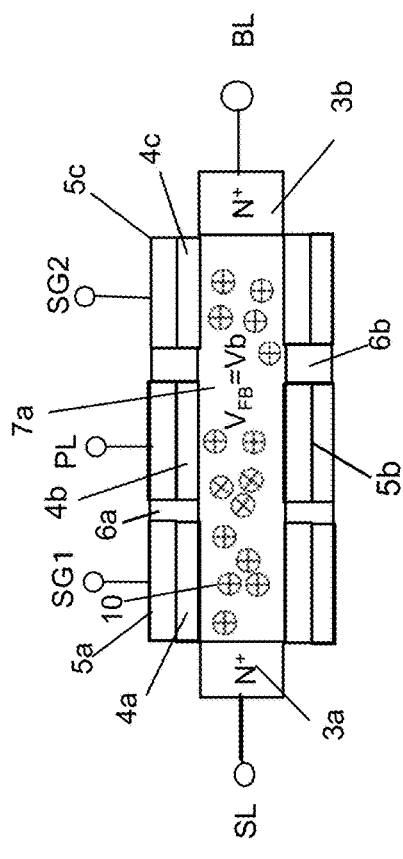
FIG. 4AB  "0" ERASED STATE
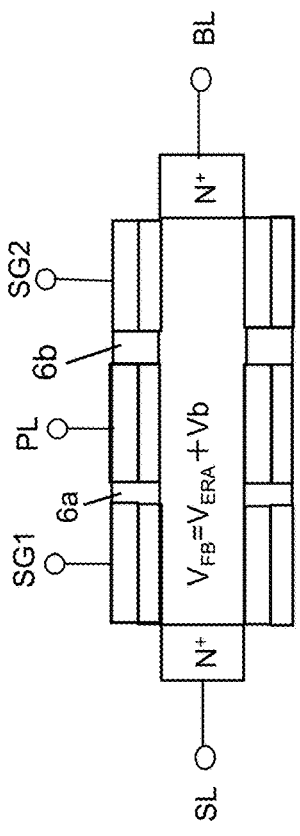
Vb: BUILT-IN VOLTAGE ~ 0.7V
FIG. 4AC
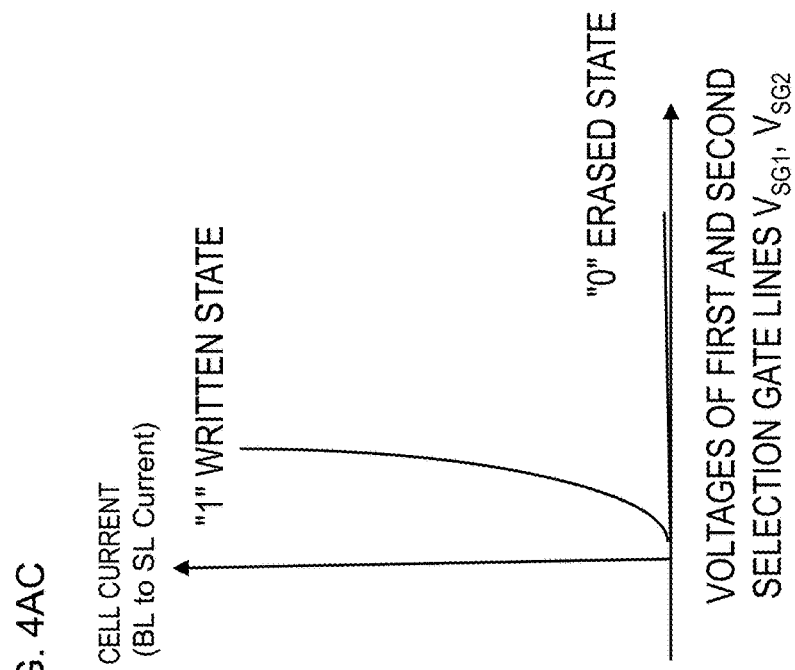

BL: BIT LINE
SL: SOURCE LINE
SG1: FIRST SELECTION GATE LINE
SG2: SECOND SELECTION GATE LINE
PL: PLATE LINE
FB: FLOATING BODY $$C_{FB} = C_{SG1} + C_{SG2} + C_{PL} + C_{BL} + C_{SL}$$

$$\Delta V_{FB} = V_{FB2} - V_{FB1}$$
$$= \frac{C_{SG1} + C_{SG2}}{C_{SG1} + C_{SG2} + C_{PL} + C_{BL} + C_{SL}} \times V_{ReadSG} \quad (1)$$

"1" WRITTEN STATE
FIG. 5AA  $V_{SG1} = V_{SG2} = V_{PL} = 0V, V_{SL} = V_{BL} = 0V$
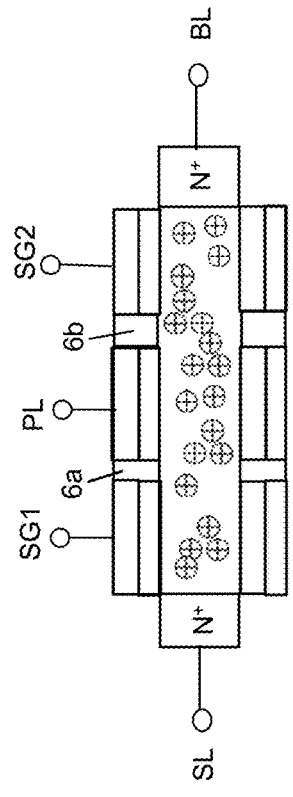
FIG. 5AB  $V_{SG1} = V_{SG2} = 0V, V_{PL} = -0.7V$
$V_{SL} = V_{BL} = 0V$
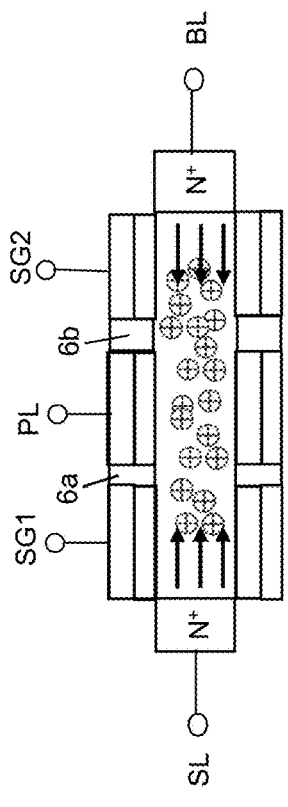
FIG. 5AC  $V_{SG1} = V_{SG2} = 0.2V, V_{PL} = 0V$
$V_{SL} = V_{BL} = 0V$
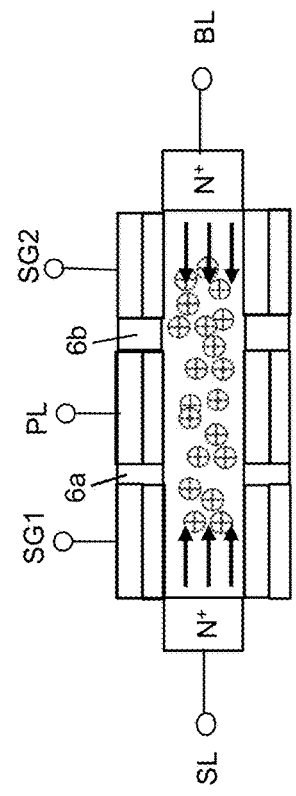

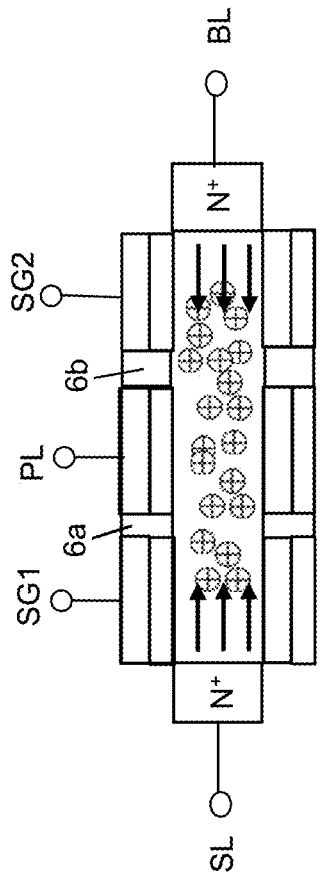
FIG. 5AD "1" WRITTEN STATE $V_{SG1} = V_{SG2} = 0.2V$, $V_{PL} = 0V$, $V_{SL} = V_{BL} = 0.3V$

MEMORY DEVICE USING SEMICONDUCTOR ELEMENT

CROSS REFERENCES TO RELATED APPLICATIONS

This application claims priority to PCT/JP2021/045965, filed Dec. 14, 2021, the entire content of which is incorporated herein by reference.

BACKGROUND OF THE INVENTION

1. Field of the Invention

The present invention relates to a memory device using a semiconductor element.

2. Description of the Related Art

In recent years, the development of large scale integration (LSI) technology has demanded higher integration and higher performance of memory elements.

In normal planar-type metal-oxide-semiconductor (MOS) transistors, the channel extends in the horizontal direction along the upper surface of a semiconductor substrate. In contrast, the channel of surrounding gate transistors (SGTs) extends in a direction perpendicular to the upper surface of a semiconductor substrate (for example, see Japanese Unexamined Patent Application Publication No. 2-188966; and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, SGTs can increase the density of a semiconductor device compared to planar-type MOS transistors. Using this SGT as a selection transistor can increase the density of the following: a dynamic random access memory (DRAM) to which a capacitor is connected (for example, see H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference (2011)); a phase change memory (PCM) to which a variable resistance element is connected (for example, see H. S. Philip Wong, S. Raoux, S. Kim, Jiale Liang, J. R. Reifenberg, B. Rajendran, M. Asheghi, and K. E. Goodson: "Phase Change Memory," Proceeding of IEEE, Vol. 98, No. 12, December, pp. 2201-2227 (2010)); a resistive random access memory (RRAM) (for example, see T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)); and a magneto-resistive random access memory (MRAM) that changes its resistance by changing the direction of magnetic spin using an electric current (for example, see W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)). In addition, there is also a DRAM memory cell composed of one MOS transistor without a capacitor (see J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012)). The present application relates to a dynamic flash memory that can be composed only of a MOS transistor without a variable resistance element or a capacitor.

FIGS. 7A to 7D illustrate a write operation, FIGS. 8A and 8B illustrate an operational problem, and FIGS. 9A to 9C illustrate a read operation of a DRAM memory cell composed of one MOS transistor without a capacitor as mentioned above (see J. Wan et al., (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, Vol. 37, No. 11, pp. 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); and E. Yoshida and T. Tanaka: "A design of a capacitorless 1T-DRAM cell using gate-induced drain leakage (GIDL) current for low-power and high-speed embedded memory," IEEE IEDM, pp. 913-916, Dec. 2003). FIG. 7A illustrates a state in which "1" is written. Here, a memory cell is formed on a silicon on insulator (SOI) substrate 100, and is composed of a source $N^+$ layer 103 to which a source line SL is connected (hereinafter, a semiconductor region containing a high concentration of donor impurities is referred to as an "$N^+$ layer"), a drain $N^+$ layer 104 to which a bit line BL is connected, a gate conductor layer 105 to which a word line WL is connected, and a floating body 102 of a MOS transistor 110. The memory cell of dynamic random access memory (DRAM) is composed of one MOS transistor 110 having no capacitor. Note that an $SiO_2$ layer 101 of the SOI substrate 100 is immediately below the floating body 102. To write "1" to the memory cell composed of one MOS transistor 110, the MOS transistor 110 is operated in a saturated range. That is, a channel 107 of electrons extending from the source $N^+$ layer 103 has a pinch-off point 108, and does not reach the drain $N^+$ layer 104 to which the bit line BL is connected. When the bit line BL connected to the drain $N^+$ layer 104 and the word line WL connected to the gate conductor layer 105 are both set to a high voltage, and when the MOS transistor 110 is operated by setting the gate voltage to about ½ of the drain voltage, the electric field strength becomes maximum at the pinch-off point 108 near the drain $N^+$ layer 104. As a result, the accelerated electrons flowing from the source $N^+$ layer 103 toward the drain $N^+$ layer 104 collide with the Si lattice and lose kinetic energy at that time, which in turn generates electron-hole pairs (impact ionization). Most of the generated electrons (not illustrated) reach the drain $N^+$ layer 104. Also, a very small number of very hot electrons jump over a gate oxide film 109 to reach the gate conductor layer 105. Holes 106 generated at the same time then charge the floating body 102. In this case, the generated holes 106 contribute as an increment of major carriers because the floating body 102 is P-type Si. The floating body 102 is filled with the generated holes 106, and, when the voltage of the floating body 102 becomes higher than the source $N^+$ layer 103 by Vb or more, further generated holes are discharged into the source $N^+$ layer 103. Here, Vb is the built-in voltage of the PN junction between the source $N^+$ layer 103 and the floating body 102 of the P layer, which is approximately 0.7 V. FIG. 7B illustrates the floating body 102 saturated and charged with the generated holes 106.

Next, the operation of writing "0" to the memory cell 110 will be described using FIG. 7C. For the common selection word line WL, randomly there are "1" written memory cells 110 and "0" written memory cells 110. FIG. 7C illustrates the change from the "1" written state to the "0" written state. When "0" is written, the voltage of the bit line BL is biased negatively and the PN junction between the drain N⁺ layer 104 and the floating body 102 of the P layer is biased forward. As a result, the holes 106 previously generated in the previous cycle in the floating body 102 flow into the drain N⁺ layer 104 connected to the bit line BL. At the end of the write operation, two memory cell states are obtained: the memory cell 110 filled with the generated holes 106 (FIG. 7B) and the memory cell 110 from which the generated holes 106 are discharged (FIG. 7C). The potential of the floating body 102 of the memory cell 110 filled with the holes 106 is higher than that of the floating body 102 having no generated holes 106. Therefore, the threshold voltage of the "1" written memory cell 110 is lower than the threshold voltage of the "0" written memory cell 110. This is illustrated in FIG. 7D.

Next, the operational problem of the memory cell composed of one MOS transistor 110 will be described using FIGS. 8A and 8B. As illustrated in FIG. 8A, the capacitance $C_{FB}$ of the floating body 102 is the sum of the capacitance $C_{WL}$ between the gate to which the word line WL is connected and the floating body 102, the junction capacitance $C_{SL}$ of the PN junction between the source N⁺ layer 103 to which the source line SL is connected and the floating body 102, and the junction capacitance $C_{BL}$ of the PN junction between the drain N⁺ layer 104 to which the bit line BL is connected and the floating body 102, which is expressed as:

$$C_{FB}=C_{WL}+C_{BL}+C_{SL} \qquad (2)$$

In addition, the capacitance coupling ratio $\beta_{WL}$ between the gate to which the word line WL is connected and the floating body 102 is expressed as:

$$\beta_{WL}=C_{WL}/(C_{WL}+C_{BL}+C_{SL}) \qquad (3)$$

Therefore, when the word line voltage $V_{WL}$ swings at the time of reading or writing, the voltage of the floating body 102, which serves as a storage node (contact) of the memory cell, is also affected. This is illustrated in FIG. 8B. When the word line voltage $V_{WL}$ rises from 0 V to $V_{WLH}$ at the time of reading or writing, the voltage $V_{FB}$ of the floating body 102 rises from an initial state voltage $V_{FB1}$ before a change in the word line voltage $V_{WL}$ to $V_{FB2}$ due to the capacitive coupling with the word line WL. The voltage change amount $\Delta V_{FB}$ is expressed as:

$$\Delta V_{FB} = V_{FB2} - V_{FB1} \qquad (4)$$
$$= \beta_{WL} \times V_{WLH}$$

Here, in $\beta_{WL}$ of equation (3), the contribution rate of $C_{WL}$ is large, which is, for example, $C_{WL}:C_{BL}:C_{SL}=8:1:1$. In this case, $\beta_{WL}=0.8$. When the word line WL changes from, for example, 5 V at the time of writing to 0 V after the writing ends, the floating body 102 is also subjected to amplitude noise at 5 V×$\beta_{WL}$=4 V due to the capacitive coupling of the word line WL and the floating body 102. For this reason, there has been a problem that the potential difference margin between the "1" potential and the "0" potential of the floating body 102 at the time of writing is not sufficient.

FIGS. 9A to 9C illustrate a read operation. FIG. 9A illustrates the state in which "1" is written, and FIG. 9B illustrates the state in which "0" is written. In practice, however, even if Vb has been written to the floating body 102 at the time of writing "1," the floating body 102 is lowered to a negative bias when the word line WL returns to 0 V at the end of writing. When "0" is written, the floating body 102 is further biased negatively. As illustrated in FIG. 9C, the potential difference margin between "1" and "0" is not large enough at the time of writing, and accordingly it is difficult to commercialize the DRAM memory cell having no capacitor in practice.

In addition, T. Ohsawa, K. Fujita, T. Higashi, Y. Iwata, T. Kajiyama, Y. Asao, and K. Sunouchi: "Memory design using a one-transistor gain cell on SOI," IEEE JSSC, Vol. 37, No. 11, pp. 1510-1522 (2002), and Takashi Ohsawa: "SOI DRAM using a single FET cell," Oyo Buturi, Vol. 75, No. 9, pp. 1131-1135 (2006) describe a method of applying a negative voltage of −1.5 V to unselected word lines WL to extend the characteristics of retaining the written "1". However, it is also described that, because 1.8 V is applied to the bit line BL at the time of writing, a voltage of 3.3 V is applied between the gate and the drain, and in memory cells connected to the unselected word lines WL, a gate-induced drain leakage current (GIDL current) causes destruction of the stored data "0". FIG. 10 illustrates a portion of a memory cell block composed of two rows by two columns of DRAM memory cells Cell_00 to Cell_11, each of which is composed of one MOS transistor. In the memory cell block, when a write operation starts, one word line WL is selected from among the unselected word lines WL to which a negative voltage WL=−1.5 V is applied, and a positive voltage WL=1.5 V is applied to the selected word line WL. Then, when "1" is written to the memory cell Cell_11, a positive voltage BL=1.8 V is applied to the bit line BL. At this time, in the unselected memory cell Cell_01, WL=−1.5 V is applied to the gate, and BL=1.8 V is applied to the drain. Therefore, −3.3 V, which is a potential difference with the drain, is applied to the gate of the unselected memory cell Cell_01. As a result, a gate-induced drain leakage current (GIDL current) is generated in the unselected memory cell Cell_01. When the stored data of the memory cell Cell_01 is "0," the stored data is destroyed.

In FIG. 10, when "0" data is written to the memory cell Cell_10, a negative voltage BL=−0.7 V is applied to the bit line BL. Since WL=−1.5 V is applied to the unselected word lines WL, the floating body of the memory cell Cell_00 is lowered to a negative voltage state by capacitive coupling with the unselected word line WL. For this reason, even if the data "1" is stored in the memory cell Cell_00, the PN junction between the drain of the memory cell Cell_00 and the floating body is not forward biased, and the destruction of the data "1" does not occur. The purpose of applying a negative voltage to the unselected word lines WL as mentioned above is to protect the data "1", but this results in a great problem that a gate-induced drain leakage current (GIDL current) is generated, causing the destruction of the data "0".

Moreover, there are memory elements in which one memory cell is formed using two MOS transistors in the silicon on insulator (SOI) layer (see, for example, US 2008/0137394 A1 and US 2003/0111681 A1, which are incorporated herein by these references). In these elements, an N⁺ layer that separates the floating body channels of the two MOS transistors, which serves as the source or drain, is formed in contact with an insulating layer. Because the N⁺ layer is in contact with the insulating layer, the floating body channels of the two MOS transistors are electrically isolated. For this reason, as described above, the voltage of the isolated floating body channels in which a group of holes which are signal charges is accumulated changes greatly, as indicated in equation (4), by applying a pulse voltage to the gate electrode of each MOS transistor. In doing so, there is a problem that the potential difference margin between "1" and "0" at the time of writing is not sufficiently large.

In a single-transistor DRAM (gain cell) having no capacitor, the capacitive coupling between the word line and the floating body is large, and, when the potential of the word line swings during data reading or writing, there is a problem that this is transmitted as noise to the floating body. In addition, the method of extending the characteristics of retaining the written "1" by applying a negative voltage of −1.5 V to the unselected word lines WL has a problem that, in memory cells connected to the unselected word lines WL, a gate-induced drain leakage current (GIDL current) is generated to destruct the stored data "0". As a result, problems such as erroneous reading and incorrect rewriting of the stored data occur, making it difficult to practicalize a single-transistor DRAM (gain cell) having no capacitor.

SUMMARY OF THE INVENTION

To solve the above-described problems, a memory device using a semiconductor element according to the present invention is a memory device in which a page is composed of a plurality of memory cells arrayed on a substrate in a row direction, and a plurality of pages are arrayed in a column direction to constitute a memory block. Each memory cell included in each of the pages includes: a semiconductor base standing on a substrate in a vertical direction relative to the substrate or extending on a substrate in a horizontal direction relative to the substrate; a first impurity layer and a second impurity layer at two ends of the semiconductor base; a first gate insulating layer surrounding a side surface of the semiconductor base between the first impurity layer and the second impurity layer, the first gate insulating layer being in contact with or proximate to the first impurity layer; a second gate insulating layer surrounding the side surface of the semiconductor base, and being connected to the first gate insulating layer; a third gate insulating layer surrounding the side surface of the semiconductor base, being connected to the second gate insulating layer, and being in contact with or proximate to the second impurity layer; a first gate conductor layer covering the first gate insulating layer; a second gate conductor layer covering the second gate insulating layer; a third gate conductor layer covering the second gate insulating layer; and a channel semiconductor layer of the semiconductor base covered with the first gate insulating layer, the second gate insulating layer, and the third gate insulating layer. The first impurity layer of the memory cell is connected to a source line, the second impurity layer is connected to a bit line, the first gate conductor layer is connected to a first selection gate line, the second gate conductor layer is connected to a drive control line, the third gate conductor layer is connected to a second selection gate line, and the bit line is connected to a sense amplifier circuit. The following are performed: an operation of controlling a voltage applied to the first gate conductor layer, the second gate conductor layer, the third gate conductor layer, the first impurity layer, and the second impurity layer to form a hole group by impact ionization inside the channel semiconductor layer, and retaining the hole group; a page write operation of setting a voltage of the channel semiconductor layer to a first data retention voltage that is higher than a voltage of one or both of the first impurity layer and the second impurity layer; a page erase operation of controlling a voltage applied to the first impurity layer, the second impurity layer, the first gate conductor layer, the second gate conductor layer, and the third gate conductor layer to extract the hole group from one or both of the first impurity layer and the second impurity layer, and then setting the voltage of the channel semiconductor layer to a second data retention voltage that is lower than the first data retention voltage by capacitive coupling of the first gate conductor layer, the second gate conductor layer, and the third gate conductor layer with the channel semiconductor layer; and a page read operation of reading page data of a memory cell group selected in at least one page to the bit line. A voltage of zero volts or less is applied to the drive control line of the memory cell connected to an unselected page among the pages (first invention).

In the first invention described above, during the page read operation, a ground voltage or higher voltage is applied to the drive control line of the memory cell connected to a selected page (second invention).

In the first invention described above, during the page read operation, a refresh operation of returning the voltage of the channel semiconductor layer of a selected page to the first data retention voltage by forming the hole group by the impact ionization inside the channel semiconductor layer of the selected page is executed (third invention).

In the first invention described above, during the page write operation, a first N-channel metal-oxide-semiconductor (MOS) transistor region having the first gate conductor layer and a third N-channel MOS transistor region having the third gate conductor layer are operated in a linear range, and a second N-channel MOS transistor region having the second gate conductor layer is operated in a saturated range (fourth invention).

In the first invention described above, the page erase operation executes: a first operation of, after increasing a voltage of the channel semiconductor layer by capacitive coupling of the first selection gate line, the second selection gate line, and the plate line with the channel semiconductor layer, reducing a voltage of the bit line and the source line to forward bias a PN junction of the first impurity layer and the second impurity layer with the channel semiconductor layer, thereby discharging the hole group; and a second operation of lowering the voltage of the channel semiconductor layer as a voltage of the first selection gate line, the second selection gate line, and the plate line is reduced by capacitive coupling of the first selection gate line, the second selection gate line, and the plate line with the channel semiconductor layer (fifth invention).

In the first invention described above, the first selection gate line and the second selection gate line are connected (sixth invention).

In the first invention described above, a total capacitance of a gate capacitance between the first gate conductor layer and the semiconductor base and a gate capacitance between the third gate conductor layer and the semiconductor base is smaller than a second gate capacitance between the second gate conductor layer and the semiconductor base (seventh invention).

In the third invention described above, a first pulse width of the first selection gate line, the second selection gate line, and the bit line during the refresh operation is longer than a second pulse width of the word line and the bit line during the page read operation (eighth operation).

In the first invention described above, the impact ionization occurs inside the channel semiconductor layer in the vicinity between the second gate conductor layer and the third gate conductor layer, and the hole group is retained inside the channel semiconductor layer (ninth invention).

In the first invention described above, during a page-accumulated read operation in which at least two pages are multiple-selected, a ground voltage or higher voltage is applied to a selected plate line, and a negative voltage is applied to an unselected plate line (tenth invention).

In the first invention described above, a voltage higher than or equal to a voltage applied to the plate line is applied to the first selection gate line and the second selection gate line of the memory cell connected to an unselected page among the pages (eleventh invention).

In the first invention described above, in plan view, the first selection gate line, the second selection gate line, the plate line, and the source line are arranged in parallel and are arranged perpendicular to the bit line (twelfth invention).

In the first invention described above, in plan view, the first selection gate line, the second selection gate line, and the plate line are arranged in parallel and are arranged perpendicular to the source line and the bit line (thirteenth invention).

BRIEF DESCRIPTION OF THE DRAWINGS

FIGS. 4AA, 4AB, and 4AC are diagrams for describing a read operation mechanism of the semiconductor memory device according to the first embodiment;

FIGS. 5AA, 5AB, 5AC, and 5AD are diagrams for describing an operation mechanism of setting the plate line of an unselected page of the semiconductor memory device according to the first embodiment to a voltage of zero volts or less;

DESCRIPTION OF THE PREFERRED EMBODIMENTS

Hereinafter, a memory device using a semiconductor element (hereinafter referred to as a dynamic flash memory) according to embodiments of the present invention will be described with reference to the drawings.

First Embodiment

Using FIGS. 1 to 5B, the structure and operation mechanisms of a dynamic flash memory cell according to a first embodiment of the present invention will be described.

Figure 1:
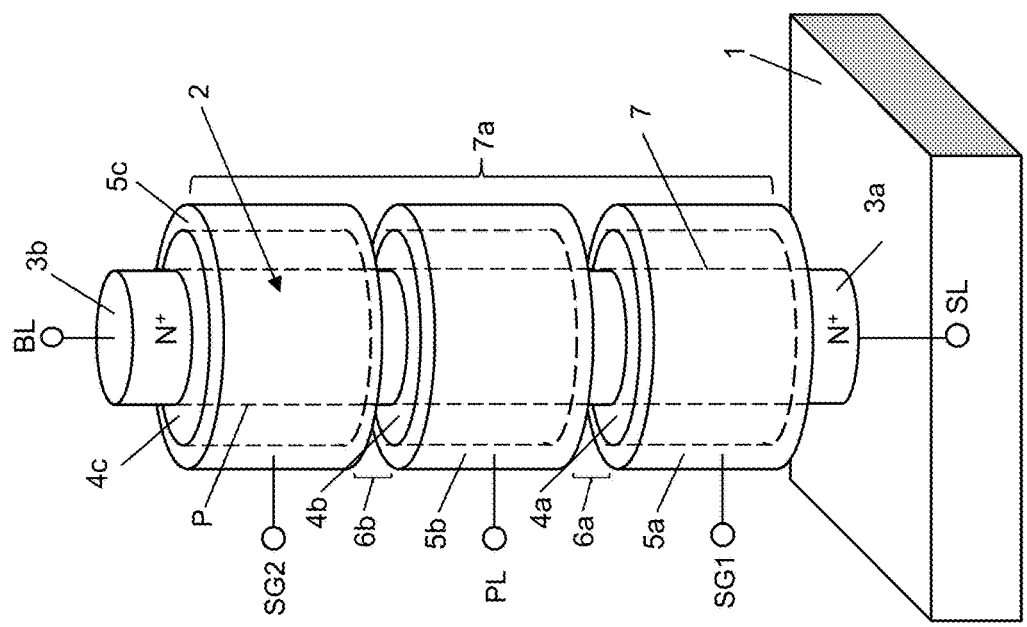
FIG. 1 is a structure diagram of a semiconductor memory device according to a first embodiment.

FIG. 1 illustrates the structure of the dynamic flash memory cell according to the first embodiment of the present invention. On a substrate 1 (which is an example of a "substrate" in the claims), there is a silicon semiconductor column 2 (which is an example of a "semiconductor column" in the claims) (hereinafter the silicon semiconductor column will be referred to as a "Si column"). The Si column 2 includes, from the bottom, an $N^+$ layer 3a (which is an example of a "first impurity layer" in the claims), a P layer 7 (hereinafter a semiconductor region containing acceptor impurities will be referred to as a "P layer"), and an $N^+$ layer 3b (which is an example of a "second impurity layer" in the claims). The P layer 7 between the $N^+$ layers 3a and 3b is a channel region 7a. The lower part of the Si column 2 is surrounded by, from the bottom, a first gate insulating layer 4a (which is an example of a "first gate insulating layer" in the claims), a second gate insulating layer 4b (which is an example of a "second gate insulating layer" in the claims), and a third gate insulating layer 4c (which is an example of a "third gate insulating layer" in the claims). The first gate insulating layer 4a is surrounded by a first gate conductor layer 5a (which is an example of a "first gate conductor layer" in the claims), the second gate insulating layer 4b is surrounded by a second gate conductor layer 5b (which is an example of a "second gate conductor layer" in the claims), and the third gate insulating layer 4c is surrounded by a third gate conductor layer 5c (which is an example of a "third gate conductor layer" in the claims). The first gate conductor layer 5a and the second gate conductor layer 5b are isolated by an insulating layer 6a, and the second gate conductor layer 5b and the third gate conductor layer 5c are isolated by an insulating layer 6b. Accordingly, a dynamic flash memory cell composed of the N$^+$ layers 3a and 3b, the P layer 7, the first gate insulating layer 4a, the second gate insulating layer 4b, the third gate insulating layer 4c, the first gate conductor layer 5a, the second gate conductor layer 5b, and the third gate conductor layer 5c is formed.

As illustrated in FIG. 1, the N$^+$ layer 3a is connected to a source line SL (which is an example of a "source line" in the claims), the N$^+$ layer 3b is connected to a bit line BL (which is an example of a "bit line" in the claims), the first gate conductor layer 5a is connected to a first selection gate line SG1 (which is an example of a "first selection gate line" in the claims), the second gate conductor layer 5b is connected to a plate line PL (which is an example of a "plate line" in the claims), and the third gate conductor layer 5c is connected to a second selection gate line SG2 (which is an example of a "second selection gate line" in the claims).

Note that it is desirable to have a structure causing the combined gate capacitance of the first gate conductor layer 5a connected to the first selection gate line SG1 and the second gate conductor layer 5b connected to the plate line PL to be greater than the gate capacitance of the third gate conductor layer 5c connected to the second selection gate line SG2.

In addition, any or all of the first gate conductor layer 5a, the second gate conductor layer 5b, and the third gate conductor layer 5c may be divided into two or more in plan view, and these may be operated synchronously or asynchronously as conductive electrodes of the first selection gate line, the plate line, and the second selection gate line. This also provides a dynamic flash memory operation.

In addition to the second gate conductor layer 5b, a gate conductor layer connected to at least one or more plate lines PL may be provided. These may be operated synchronously or asynchronously as conductive electrodes of the plate line(s) PL. This also provides a dynamic flash memory operation.

Figure 2A:
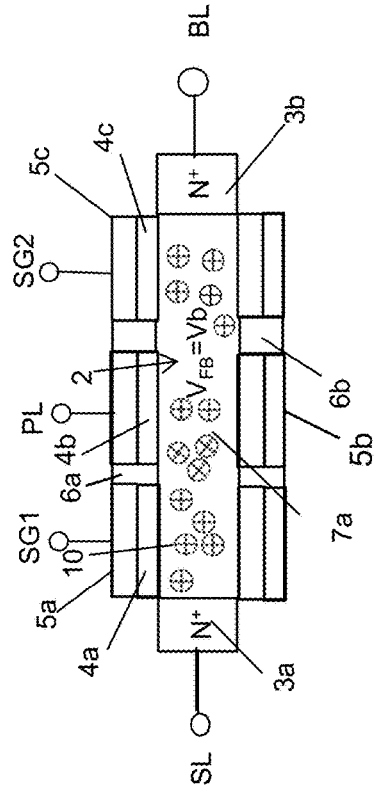
FIGS. 2A, 2B, and 2C are diagrams for describing an erase operation mechanism of the semiconductor memory device according to the first embodiment.
Figure 2B:
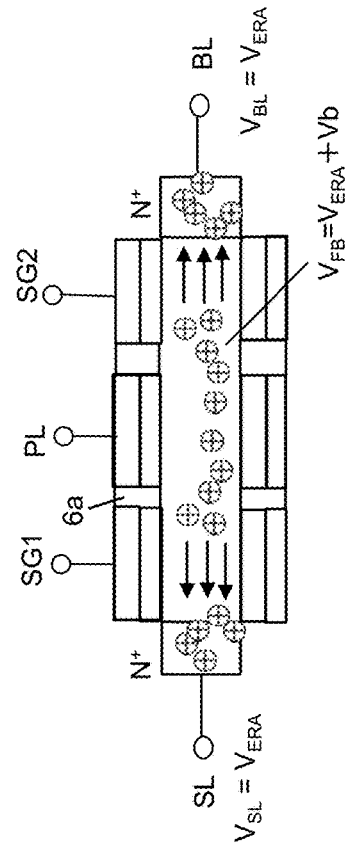
Figure 2C:
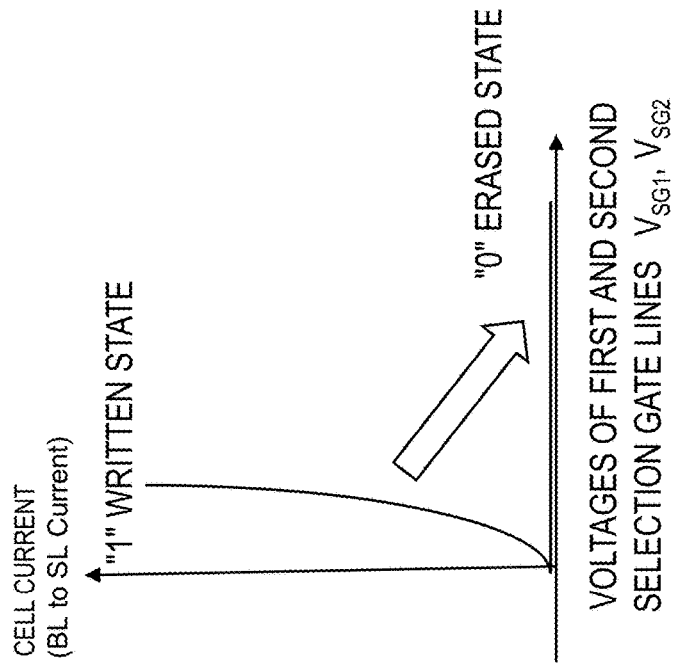

An erase operation mechanism will be described using FIGS. 2A to 2C. The channel region 7a between the N$^+$ layers 3a and 3b is electrically isolated from the substrate 1 and thus serves as a floating body. FIG. 2A illustrates a state in which a hole group 10 generated by impact ionization in the previous cycle is accumulated in the channel region 7a prior to an erase operation. Then, as illustrated in FIG. 2B, during the erase operation, the voltage of the source line SL and the voltage of the bit line BL are set to a negative voltage V$_{ERA}$. Here, V$_{ERA}$ is −1.5 V, for example. As a result, regardless of the value of the initial potential of the channel region 7a, the PN junction between the N$^+$ layer 3a serving as the source to which the source line SL is connected and the channel region 7a and the PN junction between the N$^+$ layer 3b serving as the drain to which the bit line BL is connected and the channel region 7a become forward biased. As a result, the hole group 10 accumulated in the channel region 7a, which is generated by impact ionization in the previous cycle, is sucked into the N$^+$ layer 3a of the source portion and the N$^+$layer 3b of the drain portion, and the potential V$_{FB}$ of the channel region 7a becomes a voltage near V$_{FB}$=V$_{ERA}$+Vb. Here, Vb is the built-in voltage of the PN junction and is about 0.7 V. Therefore, when V$_{ERA}$=−1.5 V, the potential of the channel region 7a is −0.8 V. This value is the potential state of the channel region 7a in the erased state. Therefore, when the potential of the channel region 7a of the floating body becomes a negative voltage, the threshold voltage of N-channel MOS transistors of the dynamic flash memory cell is increased due to a substrate biasing effect. Therefore, the threshold voltage of the first gate conductor layer 5a connected to the first selection gate line SG1, the second gate conductor layer 5b connected to the plate line PL, and the third gate conductor layer 5c connected to the second selection gate line SG2 is increased. In doing so, as illustrated in FIG. 2C, a cell current Icell becomes zero in a graph with the voltage of the first selection gate line SG1 and the second selection gate line SG2 as the x-axis. The erased state of this channel region 7a is logic storage data "0". Note that the voltage conditions applied to the bit line BL, the source line SL, the first selection gate line SG1, the plate line PL1, and the second selection gate line SG2 described above, and the potential of the floating body are examples for performing an erase operation, and may be other operational conditions under which an erase operation can be performed.

Figure 3C:
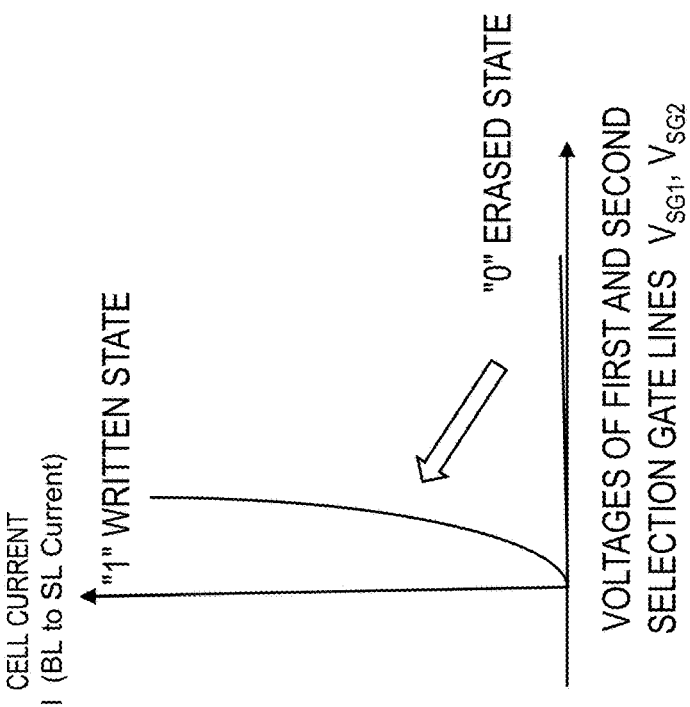
FIGS. 3A, 3B, and 3C are diagrams for describing a write operation mechanism of the semiconductor memory device according to the first embodiment.
Figure 3A:
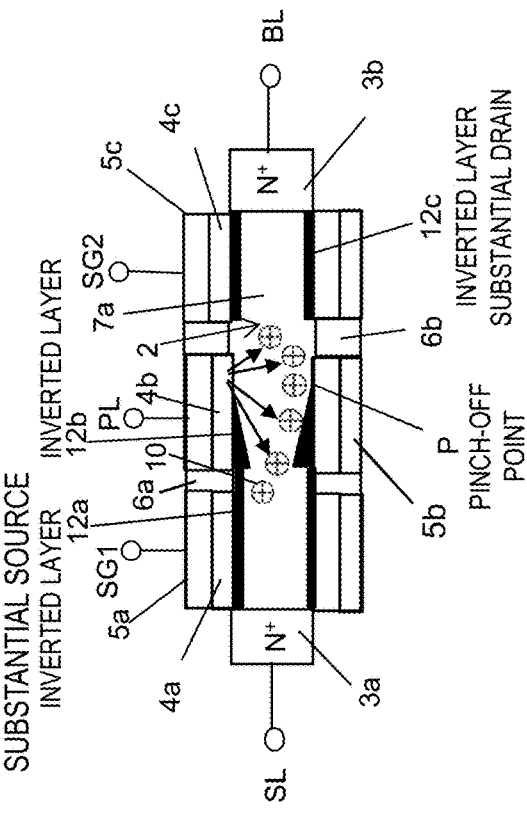
Figure 3B:
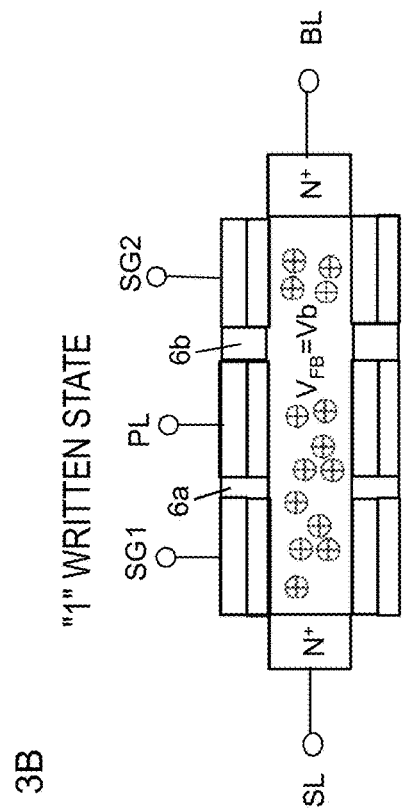

FIGS. 3A to 3C illustrate a write operation of the dynamic flash memory cell. As illustrated in FIG. 3A, for example, 0 V is input to the N$^+$ layer 3a to which the source line SL is connected; for example, 1.2 V is input to the N$^+$ layer 3b to which the bit line BL is connected; for example, 2 V is input to the first gate conductor layer 5a connected to the first selection gate line SG1 and to the third gate conductor layer 5c connected to the second selection gate line SG2; and, for example, 1.5 V is input to the second gate conductor layer 5b connected to the plate line PL. As a result, as illustrated in FIG. 3A, ring-shaped inversion layers 12a and 12c are formed in the channel region 7a inside the first gate conductor layer 5a to which the first selection gate line SG1 is connected and the third gate conductor layer 5c to which the second selection gate line SG2 is connected. As a result, a first N-channel MOS transistor region (which is an example of a "first N-channel MOS transistor region" in the claims) having the first gate conductor layer 5a and a third N-channel MOS transistor region (which is an example of a "third N-channel MOS transistor region" in the claims) having the third gate conductor layer 5c are operated in, for example, a linear range. In contrast, a second N-channel MOS transistor region (which is an example of a "second N-channel MOS transistor region" in the claims) having the second gate conductor layer 5b to which the plate line PL is connected is operated in, for example, a saturated range. As a result, there is a pinch-off point P in an inversion layer 12b. In this case, the inversion layers 12a and 12c formed entirely inside of the first gate conductor layer 5a to which the first selection gate line SG1 is connected and inside of the third gate conductor layer 5c to which the second selection gate line SG2 is connected substantially serve as the source and the drain of the second N-channel MOS transistor region having the second gate conductor layer 5b to which the plate line PL is connected.

As a result, the electric field becomes maximum in a second boundary region in the channel region 7a between the second N-channel MOS transistor region and the third N-channel MOS transistor region, which are connected in series, and impact ionization occurs in this region. Because this region is a source-side region viewed from the third N-channel MOS transistor region having the third gate conductor layer 5c to which the second selection gate SG2 is connected, this phenomenon is called source-side impact ionization. This source-side impact ionization causes electrons to flow from the N$^+$ layer 3a to which the source line SL is connected towards the N$^+$ layer 3b to which the bit line BL is connected. The accelerated electrons collide with the lattice Si atoms and their kinetic energy generates electron-hole pairs. Some of the generated electrons flow to the first gate conductor layer 5a, the second gate conductor layer 5b, and the third gate conductor layer 5c, but most of them flow to the N$^+$ layer 3b to which the bit line BL is connected. In a "1" write operation, electron-hole pairs may be generated using a gate-induced drain leakage (GIDL) current, and the generated hole group may fill inside the floating body FB (for example, see E. Yoshida and T. Tanaka (2003)).

Then, as illustrated in FIG. 3B, the generated hole group 10 includes the major carriers in the channel region 7a and charges the channel region 7a to a positive bias. Since the N$^+$ layer 3a to which the source line SL is connected is 0 V, the channel region 7a is charged to a voltage near the built-in voltage Vb (about 0.7 V) of the PN junction between the N$^+$ layer 3a to which the source line SL is connected and the channel region 7a. When the channel region 7a is charged to a positive bias, the threshold voltage of the first N-channel MOS transistor region, the second N-channel MOS transistor region, and the third N-channel MOS transistor region is lowered due to a substrate biasing effect. In doing so, as illustrated in FIG. 3C, a cell current Icell serving as the y-axis flows in a graph with the voltage of the first selection gate line SG1 and the second selection gate line SG2 as the x-axis. The written state of this channel region 7a is assigned to logic storage data "1".

Note that, during a write operation, instead of the second boundary region mentioned above, electron-hole pairs may be generated by impact ionization or a GIDL current in a first boundary region in the channel region 7a between the first N-channel MOS transistor region and the second N-channel MOS transistor region, and the generated hole group 10 may charge the channel region 7a. Alternatively, electron-hole pairs may be generated by impact ionization or a GIDL current in a boundary region between the N$^+$ layer 3a and the channel region 7a or in a boundary region between the N$^+$ layer 3b and the channel region 7a, and the generated hole group 10 may charge the channel region 7a. Note that the voltage conditions applied to the bit line BL, the source line SL, the first selection gate line SG1, the plate line PL, and the second selection gate line SG2 described above are examples for performing a write operation, and may be other voltage conditions under which a write operation can be performed.

Figure 4B:
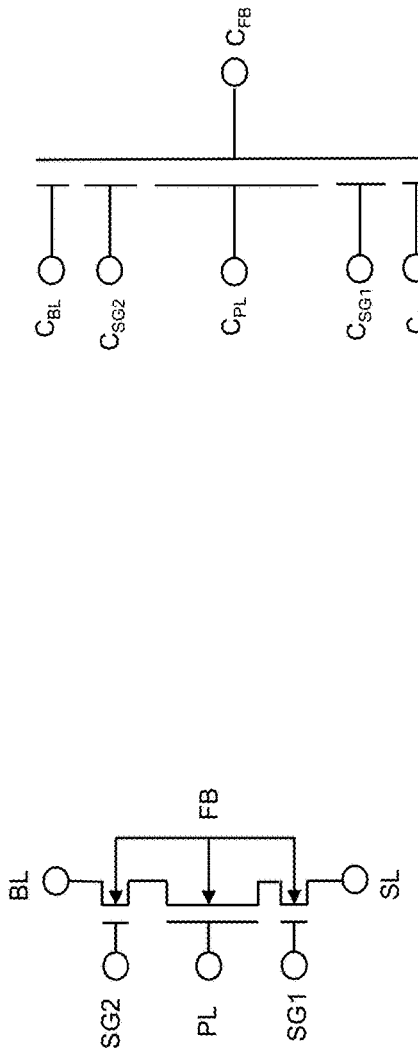
FIGS. 4BA, 4BB, and 4BC are diagrams for describing the magnitude relationship of the gate capacitances of first, second, and third gate conductor layers during a read operation of the semiconductor memory device according to the first embodiment, and operations related thereto.
Figure 4B:
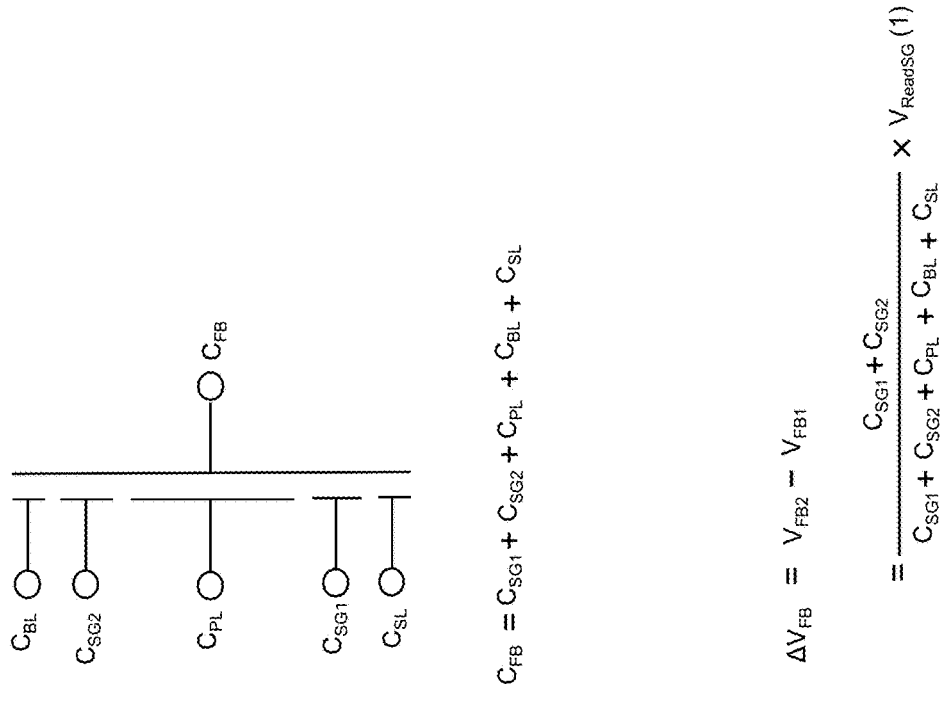
Figure 4B:
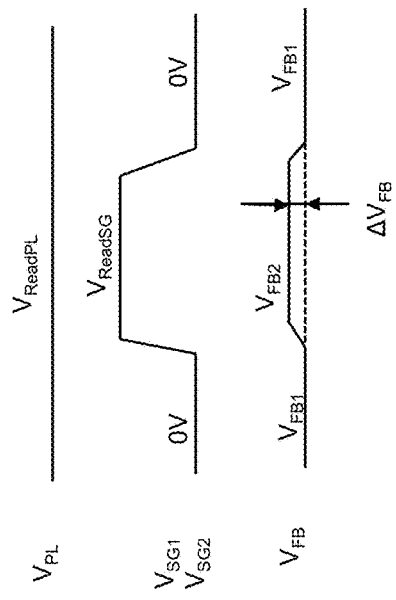

A read operation of the dynamic flash memory cell will be described using FIGS. 4A and 4B. A read operation of the dynamic flash memory cell will be described using FIGS. 4AA to 4AC. As illustrated in FIG. 4AA, when the channel region 7a is charged to the built-in voltage Vb (about 0.7 V), the threshold voltage is lowered due to a substrate biasing effect. This state is assigned to logic storage data "1". As illustrated in FIG. 4AB, if a memory block to be selected before writing is performed is in the erased state "0" in advance, the channel region 7a has the floating voltage $V_{FB}=V_{ERA}+Vb$. The written state "1" is stored randomly by a write operation. As a result, the logic storage data of logic "0" and "1" is generated for the first and second selection gate lines SG1 and SG2. As illustrated in FIG. 4AC, reading is performed with a sense amplifier using the difference between two threshold voltages for the first and second selection gate lines SG1 and SG2.

Using FIGS. 4BA to 4BC, the magnitude relationship of the gate capacitances of the first gate conductor layer 5a, the second gate conductor layer 5b, and the third gate conductor layer 5c during a read operation of the dynamic flash memory cell, and operations related thereto will be described. It is desirable to design the gate capacitance of the second gate conductor layer 5b to be larger than the combined gate capacitance of the first gate conductor layer 5a and the third gate conductor layer 5c. As illustrated in FIG. 4BA, the gate capacitance of the second gate conductor layer 5b to which the plate line PL is connected is made larger than the total gate capacitance of the first gate conductor layer 5a and the third gate conductor layer 5c to which the first selection gate line SG1 and the second selection gate line SG2 are respectively connected by making the combined vertical length of the first gate conductor layer 5a and the third gate conductor layer 5c shorter than the vertical length of the second gate conductor layer 5b to which the plate line PL is connected. FIG. 4BB illustrates an equivalent circuit of one cell of the dynamic flash memory.

FIG. 4BC illustrates the coupling capacitance relationship of the dynamic flash memory. Here, $C_{SG1}$ is the capacitance of the first gate conductor layer 5a; $C_{PL}$ is the capacitance of the second gate conductor layer 5b; $C_{SG2}$ is the capacitance of the third gate conductor layer 5c; $C_{BL}$ is the capacitance of the PN junction between the N$^+$ layer 3b serving as the drain and the channel region 7a; and $C_{SL}$ is the capacitance of the PN junction between the N$^+$ layer 3a serving as the source and the channel region 7a. As illustrated in FIG. 4BC, when the voltage of the first selection gate line SG1 and the second selection gate line SG2 swings, this operation affects the channel region 7a as noise. At this time, the potential fluctuation $\Delta V_{FB}$ of the channel region 7a is:

$$\Delta V_{FB} = (C_{SG1}+C_{SG1})/(C_{SG1}+C_{SG2}+C_{PL}+C_{BL}+C_{SL}) \times V_{ReadSG} \qquad (1)$$

Here, $V_{ReadSG}$ is an amplitude potential at the time of reading the first selection gate line SG1 and the second selection gate line SG2. As is clear from equation (1), $\Delta V_{FB}$ becomes smaller if the contribution ratio of $(C_{SG1}+C_{SG1})$ is reduced compared to the overall capacitance $(C_{SG1}+C_{SG2}+C_{PL}+C_{BL}+C_{SL})$ of the channel region 7a. By further shortening the total vertical length of the first and third gate conductor layers 5a and 5c to which the first selection gate line SG1 and the second selection gate line SG2 are respectively connected than the vertical length of the second gate conductor layer 5b to which the plate line PL is connected, $\Delta V_{FB}$ can be made yet smaller without lowering the degree of integration of the memory cell in plan view. Note that the voltage conditions applied to the bit line BL, the source line SL, the plate line PL, the first selection gate line SG1, and the second selection gate line SG2 described above, and the potential of the floating body are examples for performing a read operation, and may be other operational conditions under which a read operation can be performed.

Figure 5B:
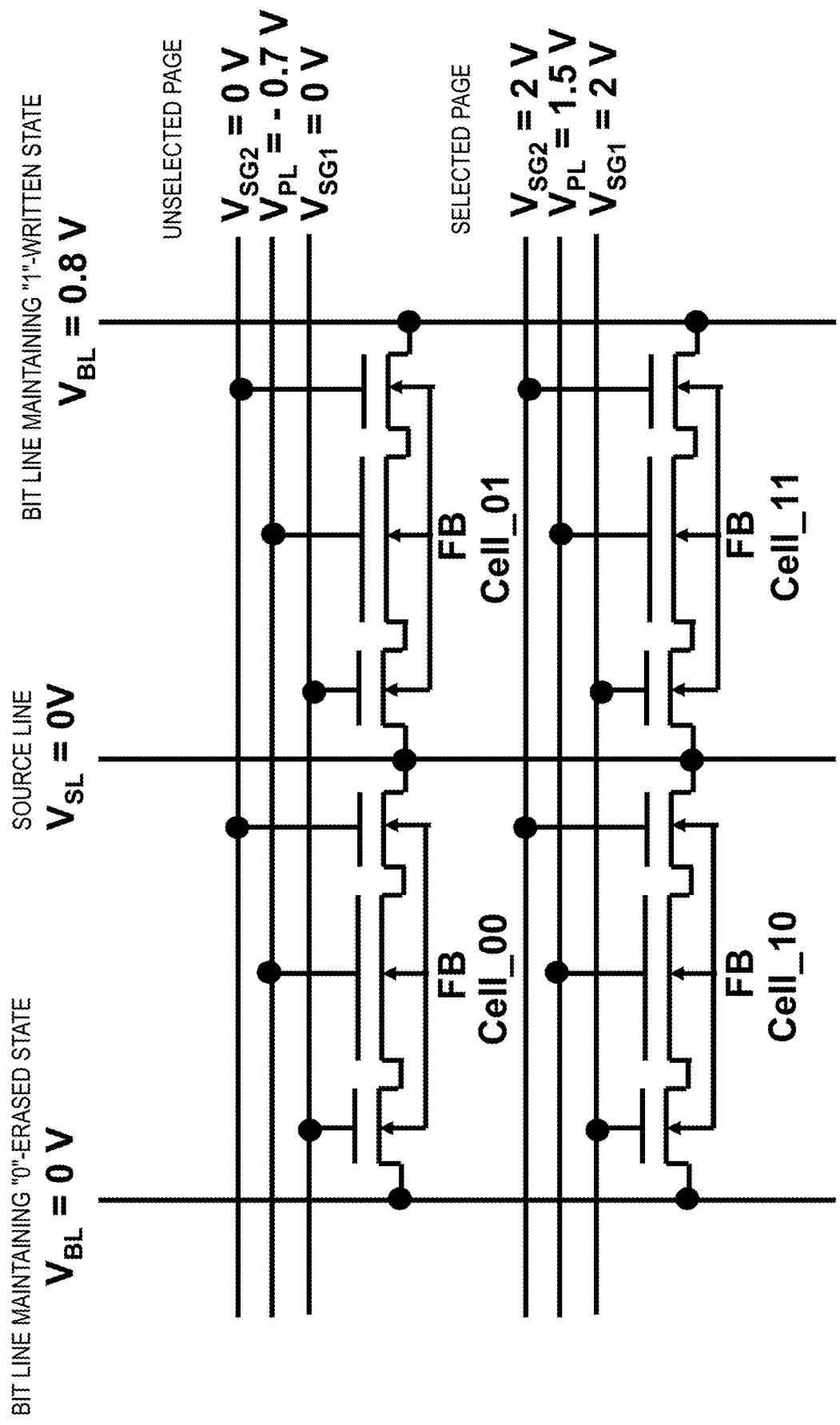
FIG. 5B is a diagram of a two-by-two memory array in which the plate line of an unselected page of the semiconductor memory device according to the first embodiment is set to a voltage of zero volts or less.

Using FIGS. 5AA to 5AD and FIG. 5B, the operation of setting the plate line PL of an unselected page of the dynamic flash memory cell to a voltage of zero volts or less will be described. FIG. 5AA illustrates the case in which, after writing "1," $V_{SG1}$, $V_{SG2}$, and $V_{PL}$, which are voltages respectively applied to the first selection gate line SG1, the second selection gate line SG2, and the plate line PL, are set to the same voltage, such as 0 V. In this case, the hole group 10 accumulated in the channel region 7a spreads throughout the channel region 7a. In contrast, FIG. 5AB illustrates the case in which, after writing "1," $V_{SG1}$ and $V_{SG2}$, which are voltages respectively applied to the first selection gate line SG1 and the second selection gate line SG2, are set to 0V, and $V_{PL}$, which is a voltage applied to the plate line PL, is set to −0.7 V. In this case, the hole group 10 accumulated in the channel region 7a is gathered in the channel region 7a surrounded by the second gate conductor layer 5b to which the plate line PL is connected. This is due to the fact that the hole group 10 having a positive charge is attracted to the channel region 7a surrounded by the second gate conductor layer 5b connected to the plate line PL to which −0.7 V, which is a negative voltage, is applied, rather than the first gate conductor layer 5a and the third gate conductor layer 5b of the first selection gate line SG1 and the second selection gate line SG2 to which 0V is applied. As a result, the hole group 10 is shielded from the PN junction between the $N^+$ layer 3a serving as the source and the channel region 7a and the PN junction between the $N^+$ layer 3b serving as the drain and the channel region 7a. This suppresses the re-coupling of holes and electrons at the PN junction between the $N^+$ layer 3a serving as the source and the channel region 7a, and at the PN junction between the $N^+$ layer 3b serving as the drain and the channel region 7a. Moreover, there is no inversion layer in a region where the first gate conductor layer 5a, the second gate conductor layer 5b, and the third gate conductor layer 5c surround the channel region 7a, and re-coupling of holes and electrons in an inversion layer does not occur at all. FIG. 5AC illustrates the case in which, after writing "1," $V_{SG1}$ and $V_{SG2}$, which are voltages respectively applied to the first selection gate line SG1 and the second selection gate line SG2, are set to 0.2 V, and $V_{PL}$, which is a voltage applied to the plate line PL, is set to 0 V. In this case, the same effect as that in FIG. 5AB is achieved. FIG. 5AC has design advantages because it is not necessary to set a voltage applied to the plate line PL to a negative voltage as in FIG. 5AB. In this manner, as illustrated in FIG. 5AB or 5AC, by setting the plate line PL of an unselected page to a voltage of zero volts or less, the characteristics of retaining the hole group 10 accumulated in the channel region 7a are greatly improved, thereby providing a quasi-nonvolatile memory with excellent retention characteristics, unmatched by ordinary volatile memory. FIG. 5AD illustrates the case in which, after writing "1," $V_{SG1}$ and $V_{SG2}$, which are voltages respectively applied to the first selection gate line SG1 and the second selection gate line SG2, are set to a positive voltage, such as 0.2 V, the voltage $V_{PL}$ applied to the plate line PL is set to, for example, 0 V, and the voltage $V_{SL}$ applied to the source line SL and the voltage $V_{BL}$ applied to the bit line BL is set to 0.3 V. In doing so, as compared to the case in FIG. 5AC, the improvement effect of characteristics that the re-coupling of holes and electrons is further suppressed can be achieved. By setting $V_{SG1}$ and $V_{SG2}$ to a positive voltage, electrons no longer exist in the channel region 7a, and re-coupling of holes and electrons is suppressed. In doing so, it is possible to retain the hole group 10 accumulated in the channel region 7a for a long time. In addition, it is desirable to set the voltage $V_{SL}$ applied to the source line SL immediately before writing, reading, and erasing to a low voltage, such as the ground voltage Vss=0 V. After writing, reading, and erasing, the voltage $V_{SL}$ applied to the source line SL and the voltage $V_{BL}$ applied to the bit line BL are returned to a positive voltage.

Using FIG. 5B, a page write operation when a negative voltage is applied to the plate line PL of an unselected page will be described. In a selected page, for example, $V_{BL}$=0 V is applied to the bit line BL of the memory cell Cell_10 maintaining "0" erased data. In addition, for example, $V_{BL}$=0.8 V is applied to the bit line BL of the memory cell Cell_11 to which "1" data is to be written. Then, for example, $V_{SG1}$=2.0 V and $V_{SG2}$=2.0 V are applied to the first selection gate line SG1 and the second selection gate line SG2 of the selected page, and, for example, $V_{PL}$=1.5 V is applied to the plate line PL. As a result, impact ionization occurs in the channel region 7a of the memory cell Cell_11, and the channel region 7a is filled with the generated hole group 10, thereby writing "1" to the memory cell Cell_11. Moreover, because the bit line BL is common in the memory cell Cell_01 of the unselected page, the voltage of the "1"-written bit line BL, $V_{BL}$=0.8 V, is applied. Then, for example, $V_{PL}$=−0.7 V is applied as the voltage of the plate line PL of the unselected page of the memory cell Cell_01. However, since there is the second selection gate line SG2 of the unselected page between the bit line BL and the plate line PL, and the voltage applied to the second selection gate line SG2 is $V_{SG2}$=0 V, the electric field between the bit line BL and the plate line PL of the memory cell Cell_01 is completely shielded by the second selection gate line SG2. As a result, no GIDL current is generated in the memory cell of the unselected page, and no disturbance, which causes erroneous writing of storage data in the memory cell, occurs, resulting in a highly reliable memory device.

Using FIGS. 6A to 6K, setting the plate line PL of an unselected page of the dynamic flash memory cell according to the first embodiment of the present invention to a negative voltage will be described.

Figure 6A:
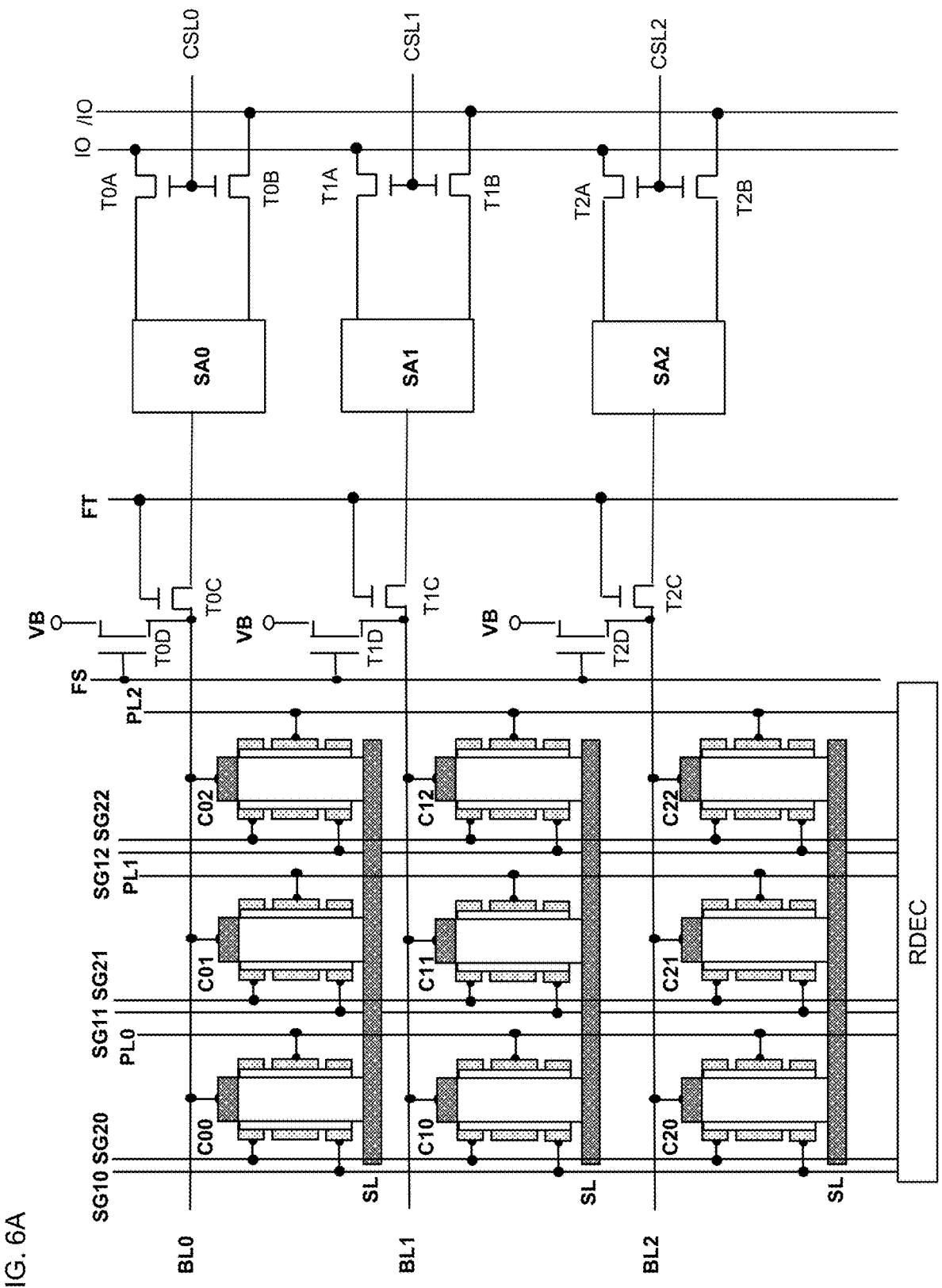
FIG. 6A is a circuit block diagram for describing an operation of setting the plate line of an unselected page of the memory device with SGT according to the first embodiment to a voltage of zero volts or less.

FIG. 6A illustrates three rows by three columns of memory cells C00 to C22 constituting a portion of a memory cell block. Although three rows by three columns of memory cells C00 to C22 are illustrated here, the memory cells in the actual memory cell block form an array larger than three rows by three columns. First selection gate lines SG10 to SG12, plate lines PL0 to PL2, second selection gate lines SG20 to SG22, a source line SL, and bit lines BL0 to BL2 are connected to the memory cells C00 to C22. In plan view, the first selection gate lines SG10 to SG12, the plate lines PL0 to PL2, and the second selection gate lines SG20 to SG22 are arranged parallel and are arranged perpendicular to the bit lines BL0 to BL2. The source line SL may be separated in units of pages as SL0, SL1, and SL2, and may be arranged parallel to the first selection gate lines SG10 to SG12, the plate lines PL0 to PL2, and the second selection gate lines SG20 to SG22, and perpendicular to the bit lines BL0 to BL2 (not illustrated). In addition, the source lines SL0, SL1, and SL2 may be arranged parallel to the bit lines BL0 to BL2 (FIG. 6A). Transistors T0C to T2C having gates to which a transfer signal FT is input constitute a switch circuit. In transistors T0D to T2D having gates connected to a bit line precharge signal FS, their drains are connected to a bit line power supply VB, and their sources are connected to the bit lines BL0 to BL2. Then, the bit lines BL0 to BL2 are connected to sense amplifier circuits SA0 to SA2 (which are examples of a "sense amplifier circuit" in the claims), respectively, via the transistors T0C to T2C, which constitute a switch circuit. The first selection gate lines SG10 to SG12, the plate lines PL0 to PL2, and the second selection gate lines SG20 to SG22 are connected to a row decoder circuit RDEC. The sense amplifier circuits SA0 to SA2 are connected to a pair of complementary input/output lines IO and /IO via transistors T0A to T2B having gates connected to column selection lines CSL0 to CSL2. Note that FIG. 6A illustrates a state in which, for example, the erase operation illustrated in FIGS. 2A to 2C is performed in advance in the entire memory cell block, and no hole group 10 is accumulated in the channel region 7a.

Figure 6B:
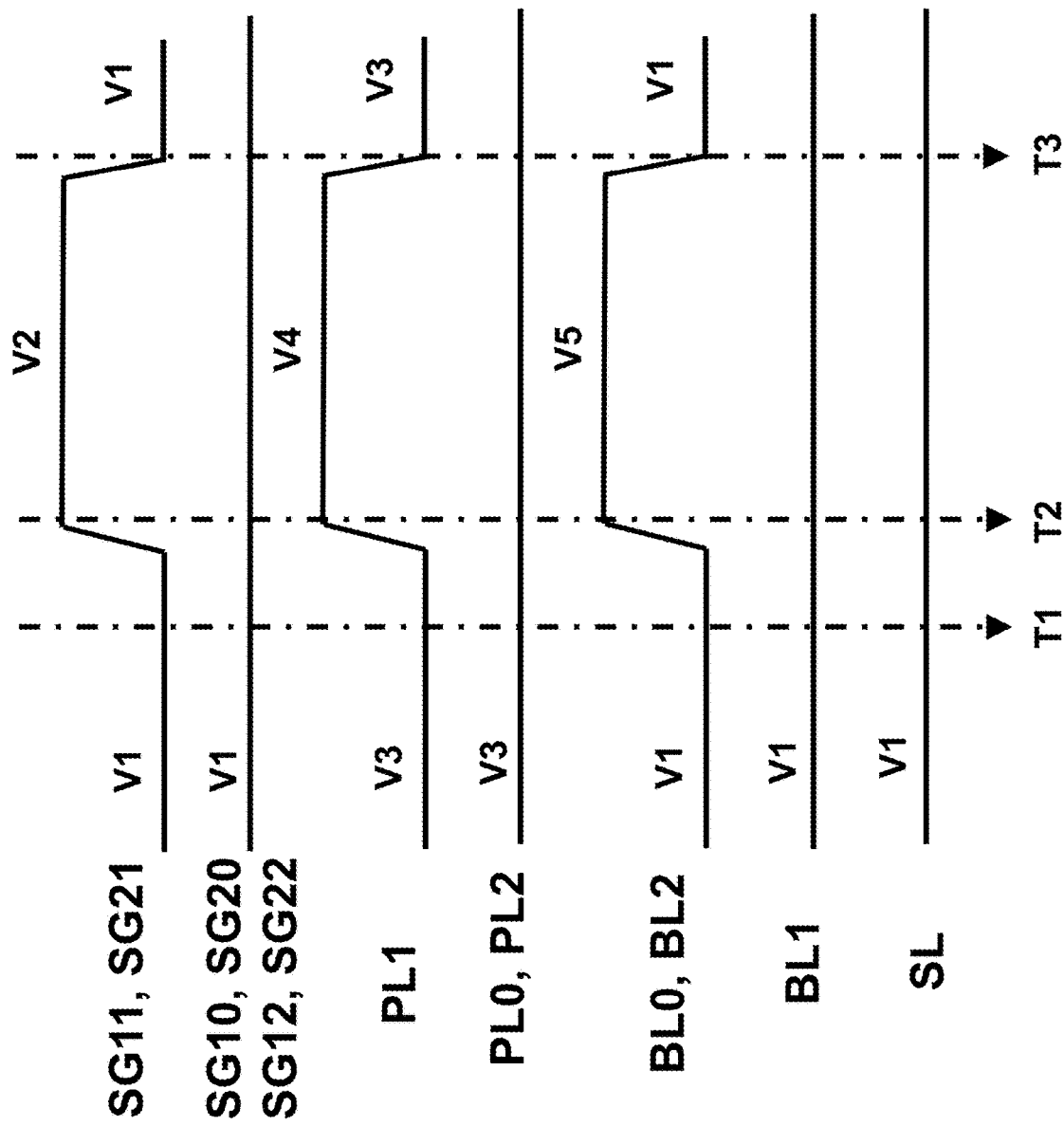
FIG. 6B is an operation waveform diagram for describing the operation of setting the plate line of the unselected page of the memory device with SGT according to the first embodiment to a voltage of zero volts or less.
Figure 6C:
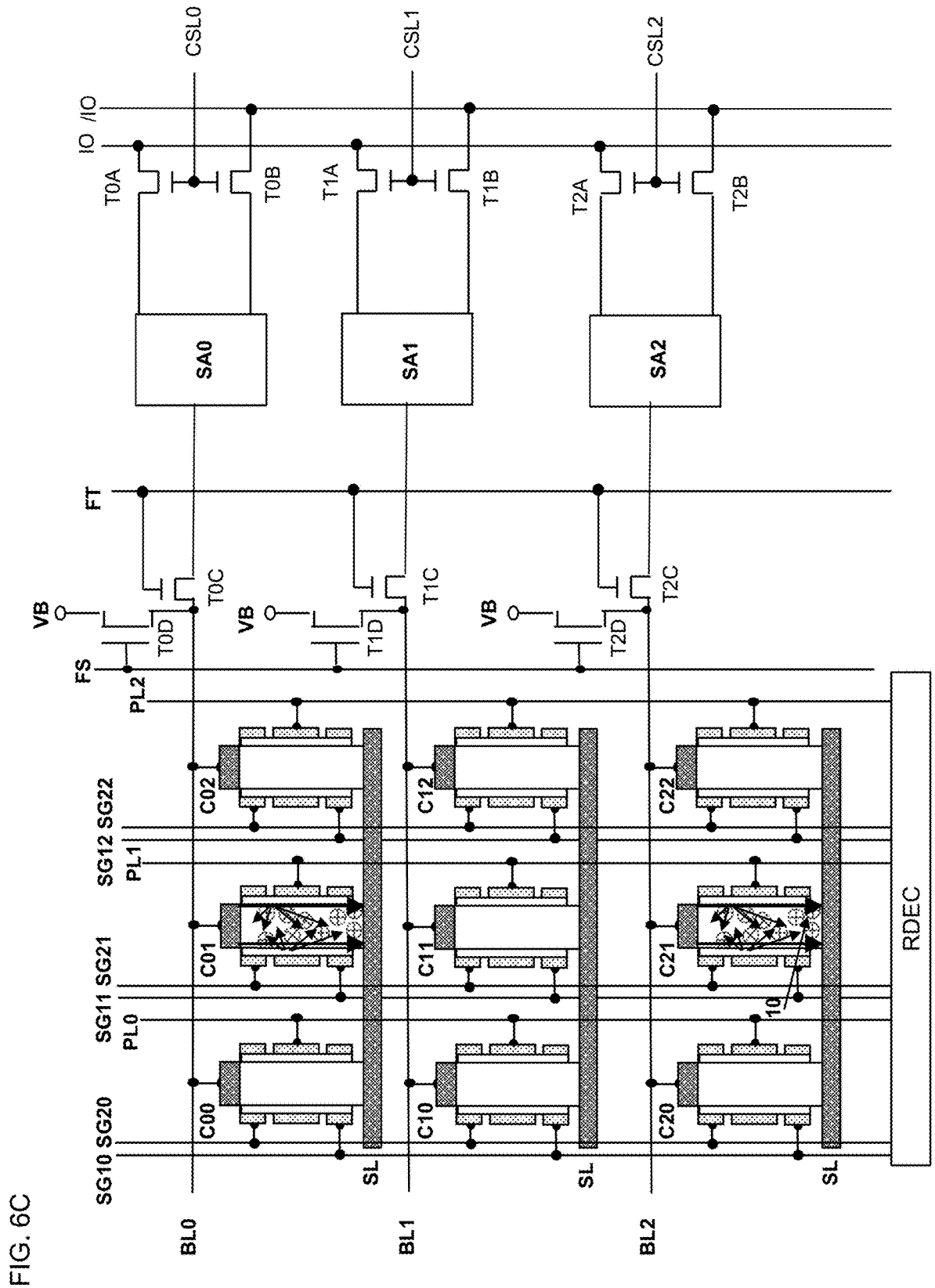
FIG. 6C is a circuit block diagram for describing the operation of setting the plate line of the unselected page of the memory device with SGT according to the first embodiment to a voltage of zero volts or less.

FIG. 6B is an operation waveform diagram in which "1" is randomly written to the memory cells C01 and C21 among the memory cells C00 to C22 in FIG. 6A, and the hole group 10 is accumulated in the channel region 7a of the memory cells C01 and C21. At a first time T1 before a page write operation (which is an example of a "page write operation" in the claims) starts, a first voltage V1 is applied to all the first and second selective gate lines SG10 to SG22. Here, the first voltage V1 is, for example, 0 V, which is the ground voltage (which is an example of a "ground voltage" in the claims) Vss. In addition, a third voltage V3, which is a negative voltage, such as −0.7 V, is applied to the plate lines PL0 to PL2. In doing so, the hole group 10 accumulated in the channel region 7a of the memory cells of unselected pages is mainly present on the plate lines PL0 to PL2 side. As a result, re-coupling of holes and electrons at the PN junction between the bit line BL and the channel region 7a and between the source line SL and the channel region 7a is suppressed. Moreover, by applying a negative voltage to the plate lines PL0 to PL2, there is no inversion layer in the channel region 7a. This prevents the reduction of the hole group 10 serving as a signal. Furthermore, the first voltage V1 is applied to the bit lines BL0 to BL2 and the source line SL.

At a second time T2 in FIG. 6B, when a page write operation starts, the voltage of the first selection gate line SG11 and the second selection gate line SG21 of a selected page rises from the first voltage V1 to a second voltage V2. Here, the second voltage V2 is, for example, 2.0 V. In addition, the voltage of the plate line PL1 of the selected page rises from the third voltage V3 to a fourth voltage V4. Here, the fourth voltage V4 is, for example, 1.5 V. In addition, the voltage of the bit lines BL0 and BL2 where "1" is to be written rises from the first voltage V1 to a fifth voltage V5. Here, the fifth voltage V5 is, for example, 0.8 V. Because data has been erased in advance in the memory cells C01 and C21, the threshold voltage of the first N-channel MOS transistor region and the third N-channel MOS transistor region is, for example, 1.2 V, which is high. Therefore, the first N-channel MOS transistor region and the third N-channel MOS transistor region operate in a linear range, and the second N-channel MOS transistor region operates in a saturated range. As a result, source-side impact ionization occurs between the second N-channel MOS transistor region and the third N-channel MOS transistor region, and, as illustrated in the circuit block diagram of FIG. 6C, the hole group 10 is accumulated in the channel region 7a of the memory cells C01 and C21.

After the voltage of the channel region 7a of the memory cells C01 and C21 reaches a desired first data retention voltage, at a third time T3, the voltage of the first selection gate line SG11 and the second selection gate line SG21 of the selected page drops from the second voltage V2 to the first voltage V1, the voltage of the plate line PL1 of the selected page drops from the fourth voltage V4 to the third voltage V3, the voltage of the bit lines BL0 and BL2 where "1" has been written drops from the fifth voltage V5 to the first voltage V1, and the page write operation ends. Therefore, from the third time T3 onward, the third voltage V3, which is a negative voltage, such as −0.7 V, is applied to all the plate lines PL0 to PL2. In doing so, the hole group 10 accumulated in the channel region 7a of the memory cells of unselected pages is mainly present on the plate lines PL0 to PL2 side. As a result, re-coupling of holes and electrons at the PN junction between the bit line BL and the channel region 7a and at the PN junction between the source line SL and the channel region 7a is suppressed. In addition, by applying a negative voltage to the plate lines PL0 to PL2, no inversion layer is formed in the channel region 7a. This prevents the reduction of the hole group 10 serving as a signal.

Figure 6D:
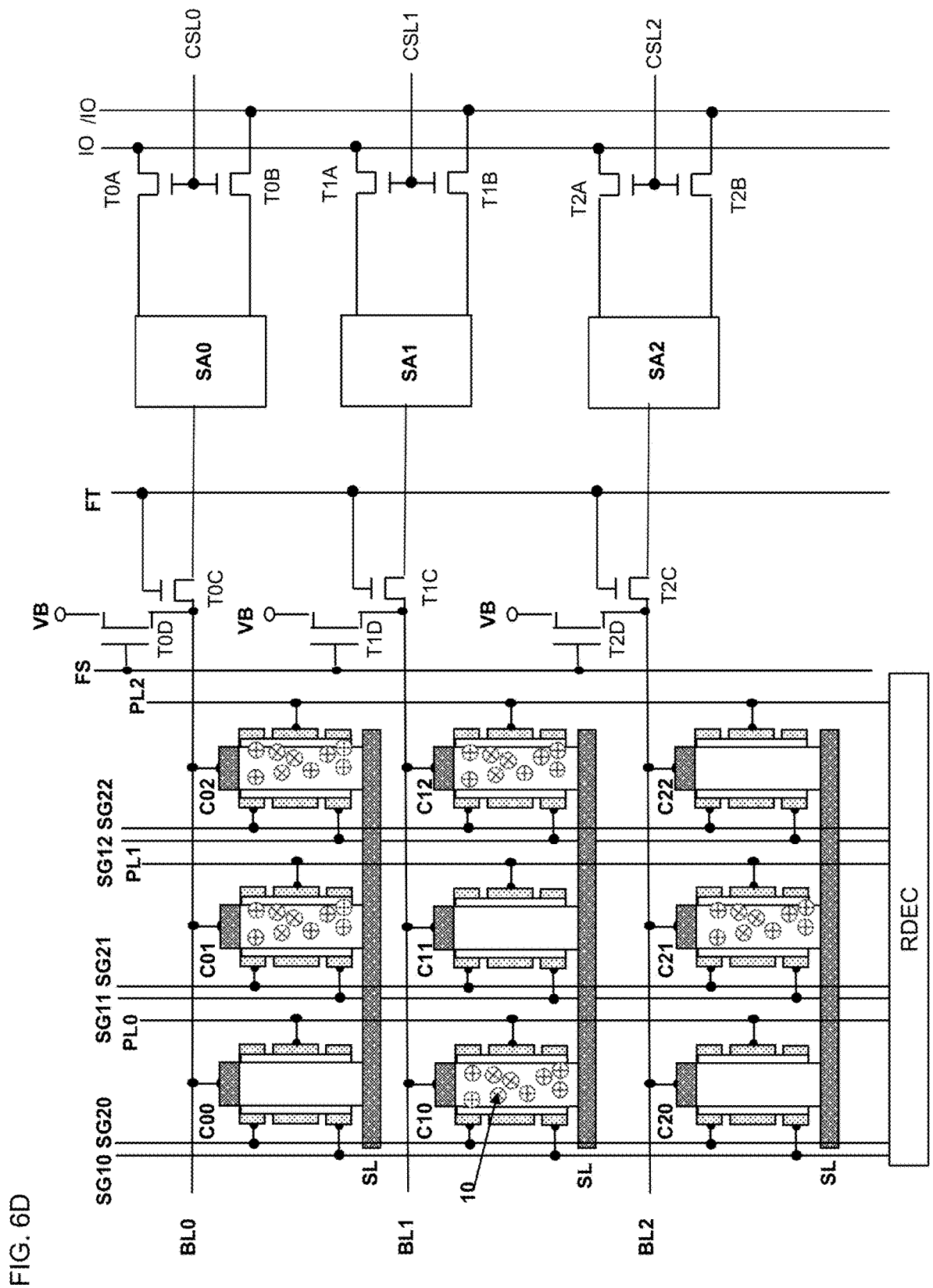
FIG. 6D is a circuit block diagram for describing the operation of setting the plate line of the unselected page of the memory device with SGT according to the first embodiment to a voltage of zero volts or less.
Figure 6E:
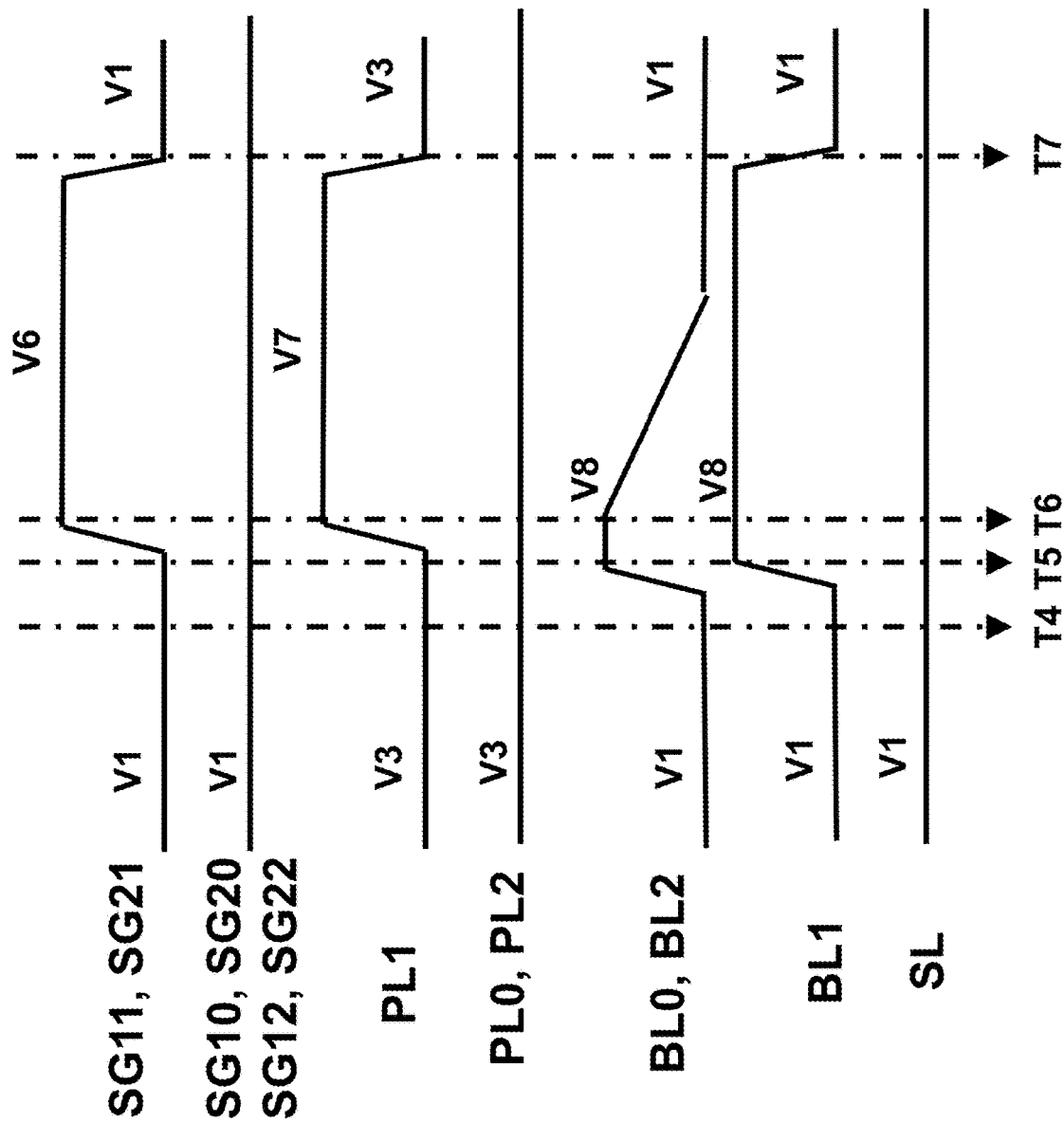
FIG. 6E is an operation waveform diagram for describing the operation of setting the plate line of the unselected page of the memory device with SGT according to the first embodiment to a voltage of zero volts or less.

FIG. 6D is a circuit block diagram in which, at any time point, "1" is randomly written to the memory cells C10, C01, C21, C02, and C12 among the memory cells C00 to C22, and the hole group 10 is accumulated in the channel region 7a of these memory cells C10, C01, C21, C02, and C12. FIG. 6E is an operation waveform diagram of reading the memory cells in FIG. 6D. At a fourth time T4 before a page read operation (which is an example of a "page read operation" in the claims) starts, the first voltage V1 is applied to the first selection gate line SG11 and the second selection gate line SG21. Here, the first voltage V1 is, for example, 0 V, which is the ground voltage Vss. In addition, the third voltage V3, which is a negative voltage, such as −0.7 V, is applied to the plate lines PL0 to PL2. In doing so, the hole group 10 accumulated in the channel region 7a of the memory cells of unselected pages is mainly present on the plate lines PL0 to PL2 side. As a result, re-coupling of holes and electrons at the PN junction between the bit line BL and the channel region 7a is suppressed. In addition, by applying a negative voltage to the plate lines PL0 to PL2, no inversion layer is formed in the channel region 7a. This prevents the reduction of the hole group 10 serving as a signal. Furthermore, the first voltage V1 is applied to the bit lines BL0 to BL2 and the source line SL.

Figure 6F:
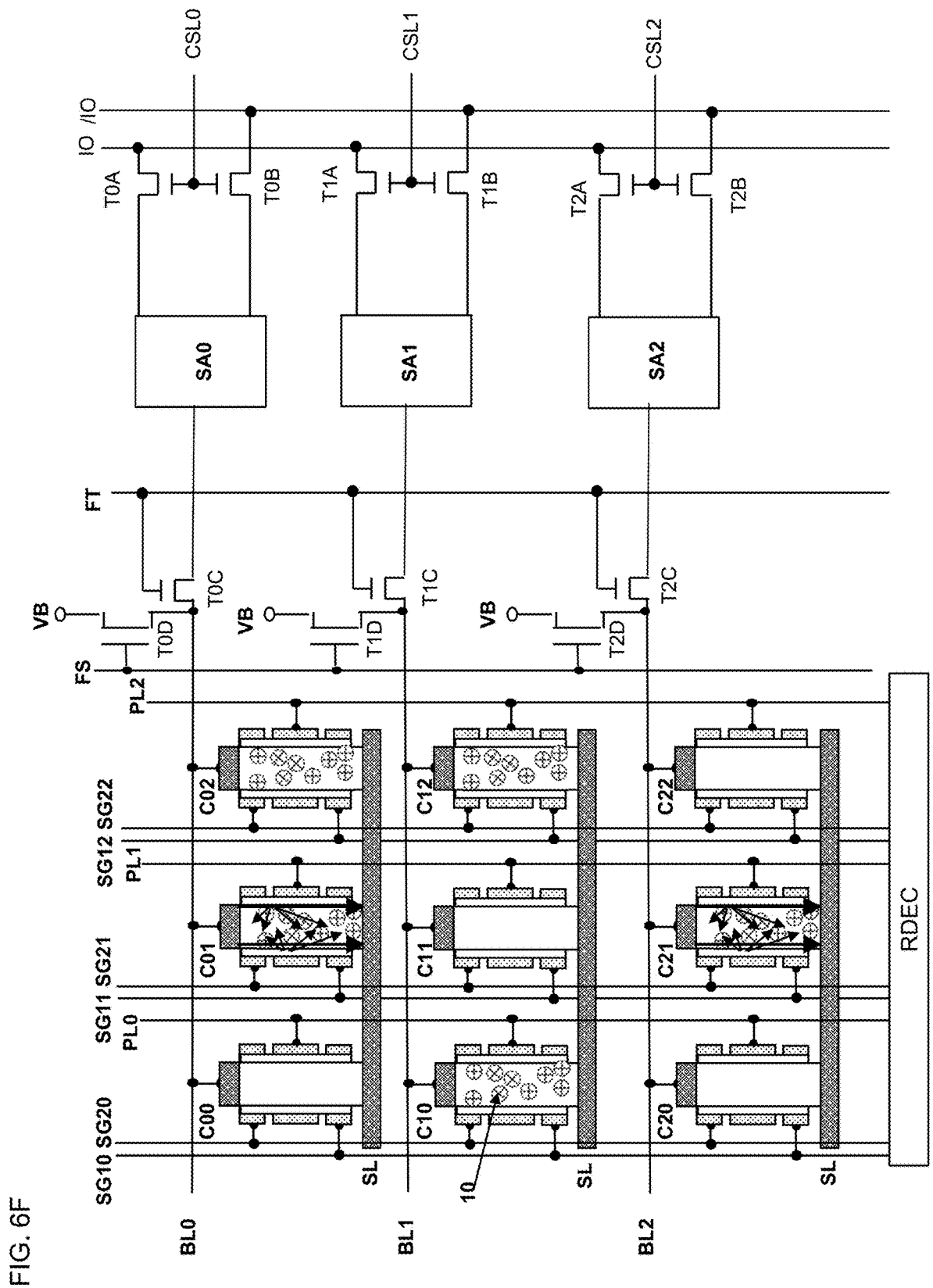
FIG. 6F is a circuit block diagram for describing the operation of setting the plate line of the unselected page of the memory device with SGT according to the first embodiment to a voltage of zero volts or less.

At a fifth time T5 in FIG. 6E, when a page read operation starts, all the bit lines BL0 to BL2 are pre-charged from the first voltage V1 to an eighth voltage V8. Here, the eighth voltage V8 is, for example, 0.8 V. At a sixth time T6, the voltage of the first selection gate line SG11 and the second selection gate line SG21 of a selected page rises from the first voltage V1 to a sixth voltage V6. Here, the sixth voltage V6 is, for example, 1.0 V. In addition, the voltage of the plate line PL1 of the selected page rises from the third page V3 to a seventh voltage V7. Here, the seventh voltage V7 is, for example, 0.8 V. As a result, page data (which is an example of "page data" in the claims) stored in a first memory cell group C01, C11, and C21 (which is an example of a "memory cell group" in the claims) belonging to a first page is read to the bit lines BL0 to BL2. Since "1" has been written to the memory cells C01 and C21, as illustrated in FIG. 6F, a memory cell current flows, and the bit lines BL0 and BL2 are discharged. In contrast, since the memory cell C11 remains in the erased state "0", no memory cell current flows.

As illustrated in FIG. 6F, a memory cell current flows in the memory cells C01 and C21 to re-generate a hole group 10 inside the channel region 7a by impact ionization. As a result, a refresh operation (which is an example of a "refresh operation" in the claims) can be automatically performed to return the voltage of the "1"-written channel region 7a of the selected page to the first data retention voltage. Then, the page data read to the bit lines BL0 to BL2 is read to the sense amplifier circuits SA0 to SA2.

At a seventh time T7 in FIG. 6E, the voltage of the first selection gate line SG11 and the second selection gate line SG21 of the selected page drops from the sixth voltage V6 to the first voltage V1, the voltage of the plate line PL1 of the selected page drops from the seventh voltage V7 to the third voltage V3, the voltage of the bit lines BL0 to BL2 is reset to the first voltage V1, and the page read operation ends. Therefore, from the seventh time T7 onward, the third voltage V3, which is a negative voltage, such as −0.7 V, is applied to all the plate lines PL0 to PL2. In doing so, the hole group 10 accumulated in the channel region 7a of the memory cells of unselected pages is mainly present on the plate lines PL0 to PL2 side. As a result, re-coupling of holes and electrons at the PN junction between the bit line BL and the channel region 7a and between the source line SL and the channel region 7a is suppressed. In addition, by applying a negative voltage to the plate lines PL0 to PL2, no inversion layer is formed in the channel region 7a. This prevents the reduction of the hole group 10 serving as a signal.

Although the case where the bit lines BL0 to BL2 are pre-charged to the eighth voltage V8 when the memory cells C01 to C21 are read to the bit lines BL0 to BL2 has been described, the transistors T0D to T2D may be used as bit line load transistors to antagonize a memory cell current and the conductivity current of the load transistors, thereby statically reading the memory cells C01 to C21 to the bit lines BL0 to BL2.

In FIG. 6D, a page-accumulated read operation (which is an example of a "page-accumulated read operation" in the claims) in which at least two pages are multiple-selected is also possible. During the page-accumulated read operation, in FIG. 6D, for example, three pages are multiple-selected. Then, memory cell currents Icell are added at the bit lines BL0 to BL2. In this case, static reading in which the memory cell currents are antagonized with the conductivity current of the load transistors is desirable.

Figure 6G:
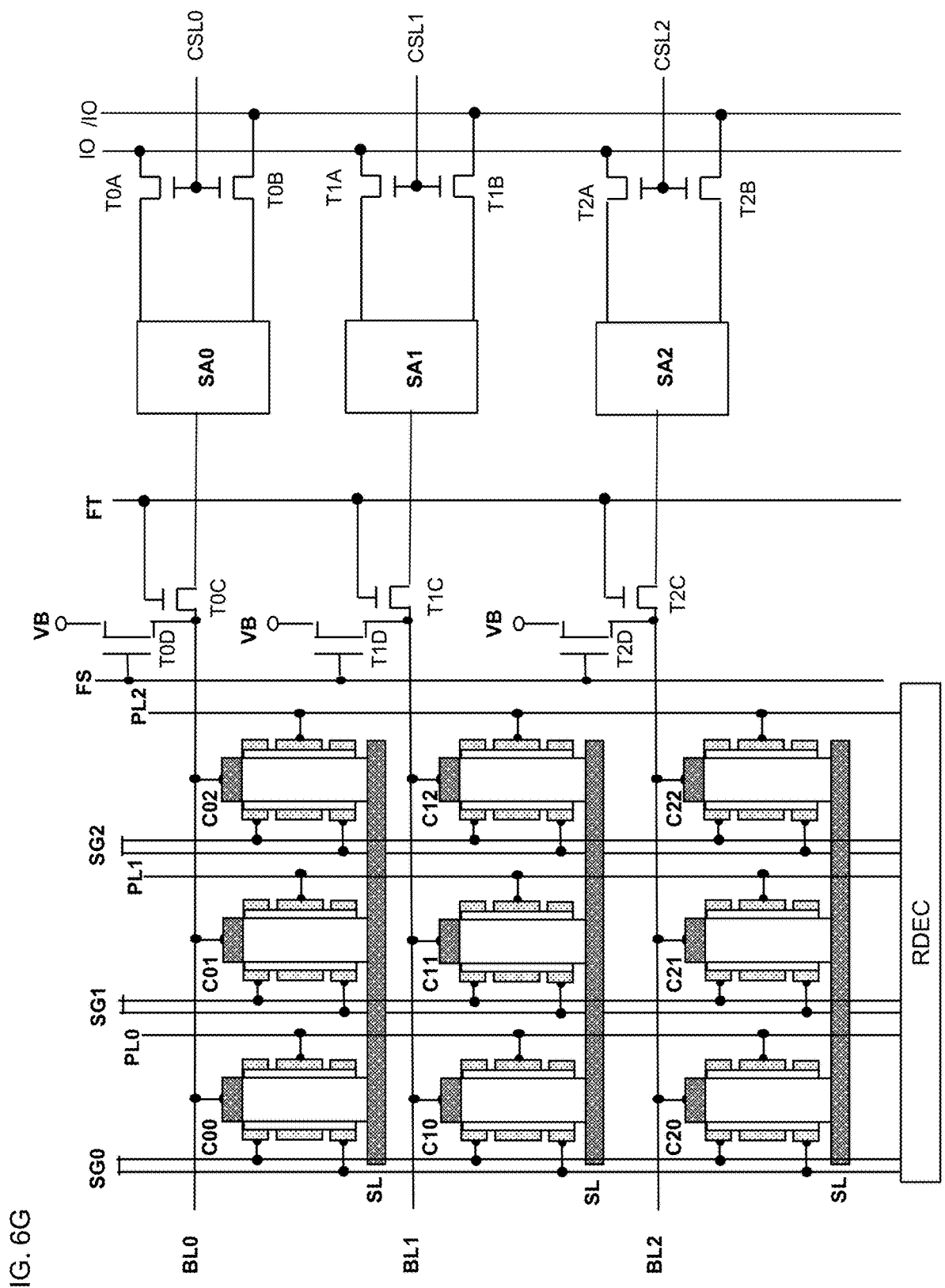
FIG. 6G is a circuit block diagram for describing the operation of setting the plate line of the unselected page of the memory device with SGT according to the first embodiment to a voltage of zero volts or less.

FIG. 6G illustrates an example of selection gate lines SG0 to SG2 in a block of three rows by three columns of the memory cells C00 to C22, with the first and second selection gate lines shared at the end of the memory cell block. In this configuration, the plate lines PL of unselected pages of the dynamic flash memory cell according to the first embodiment of the present invention can also be set to a negative voltage.

Figure 6H:
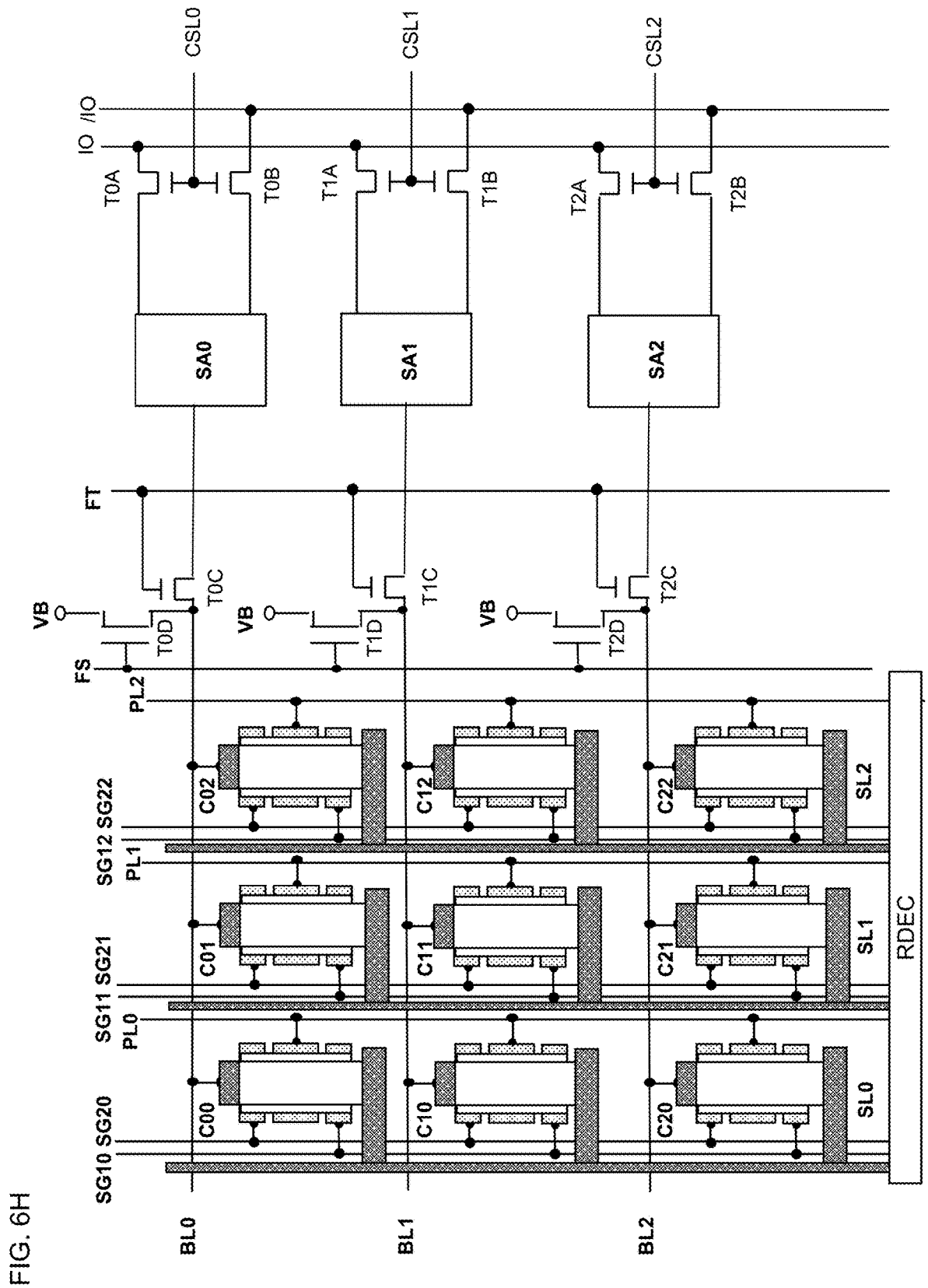
FIG. 6H is a circuit block diagram for describing the operation of setting the plate line of the unselected page of the memory device with SGT according to the first embodiment to a voltage of zero volts or less.

FIG. 6H illustrates an example in which, in a block of three rows by three columns of the memory cells C00 to C22, the source line SL is arranged separately as the source line SL0 parallel to the plate line PL0, the first selection gate line SG10, and the second selection gate line SG20, the source line SL1 parallel to the plate line PL1, the first selection gate line SG11, and the second selection gate line SG21, and the source line SL2 parallel to the plate line PL2, the first selection gate line SG12, and the second selection gate line SG22. The source lines SL0 to SL2 are connected to the row decoder circuit RDEC to be decoded. In this configuration, the plate lines PL of unselected pages of the dynamic flash memory cell according to the first embodiment of the present invention can also be set to a negative voltage.

Figure 6I:
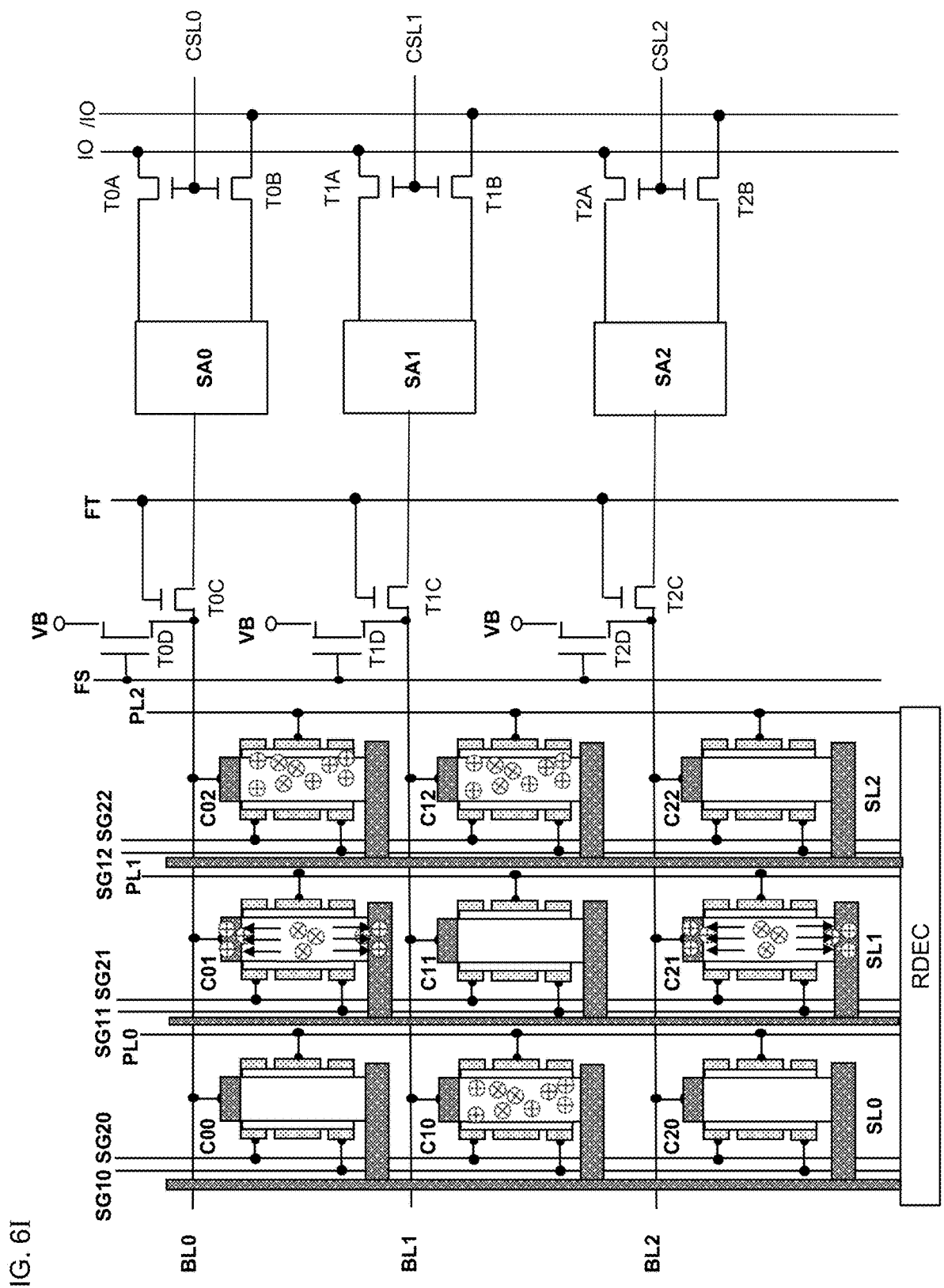
FIG. 6I is a circuit block diagram for describing the operation of setting the plate line of the unselected page of the memory device with SGT according to the first embodiment to a voltage of zero volts or less.

Moreover, using FIGS. 6I to 6K, a page erase operation (which is an example of a "page erase operation" in the claims) in the block of three rows by three columns of the memory cells C00 to C22 with the separated source lines SL0 to SL2 will be described. As illustrated in an operation waveform diagram of FIG. 6J, at an eighth time T8 before a page erase operation starts, the first voltage V1 is applied to all the first and second selection gate lines SG10 to SG22. Here, the first voltage V1 is, for example, 0 V, which is the ground voltage Vss. In addition, the third voltage V3, which is a negative voltage, such as −0.7 V, is applied to the plate lines PL0 to PL2. In doing so, the hole group 10 accumulated in the channel region 7a of the memory cells of unselected pages is mainly present on the plate lines PL0 to PL2 side. As a result, re-coupling of holes and electrons at the PN junction between the bit line BL and the channel region 7a and between the source line SL and the channel region 7a is suppressed. In addition, by applying a negative voltage to the plate lines PL0 to PL2, there is no inversion layer in the channel region 7a.

Figure 6J:
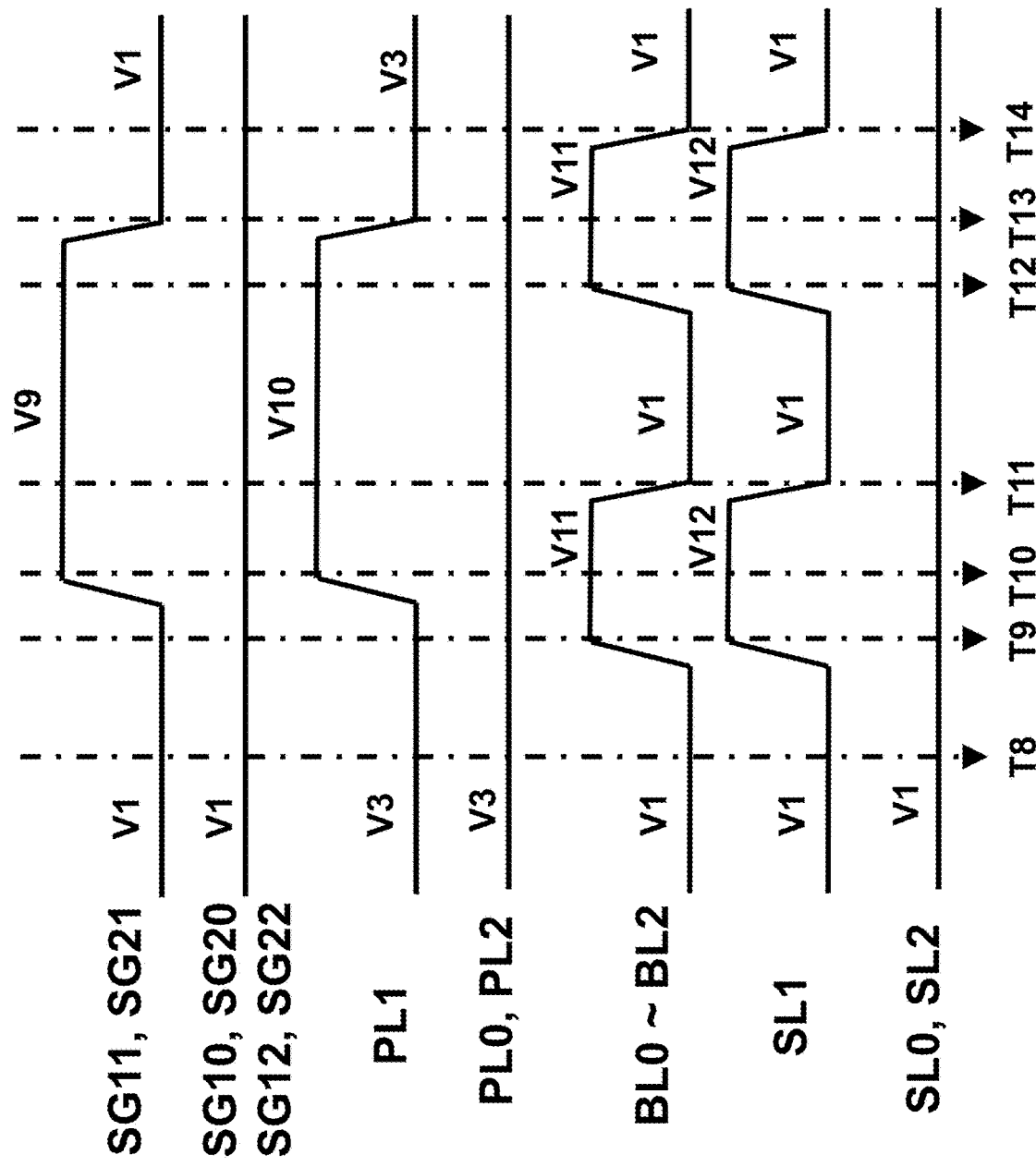
FIG. 6J is an operation waveform diagram for describing the operation of setting the plate line of the unselected page of the memory device with SGT according to the first embodiment to a voltage of zero volts or less.

At a ninth time T9 in FIG. 6J, when a page erase operation starts, the voltage of the bit lines BL0 to BL2 and the voltage of the source line SL1 rise from the first voltage V1 to an eleventh voltage V11 and a twelfth voltage V12, respectively. Here, the eleventh voltage V11 and the twelfth voltage V12 are, for example, 2.0 V. Then, at a tenth time T10, the voltage of the first selection gate line SG11 and the second selection gate line SG21 of a selected page rises from the first voltage V1 to a ninth voltage V9, and the voltage of the plate line PL1 rises from the third voltage V3 to a tenth voltage V10. Here, the ninth voltage V9 and the tenth voltage V10 are, for example, 1.5 V. Since the voltage of the bit lines BL0 to BL2 and the voltage of the source line SL1 have already risen respectively to the eleventh voltage V11 and the twelfth voltage V12 at the ninth time T9, no inversion layer is formed in the channel region 7a due to the voltage rise of the first selection gate line SG11, the second selection gate line SG21, and the plate line PL1 of the selected page at the tenth time T10. As a result, the voltage of the channel region 7a, which is a floating body, rises due to capacitive coupling of the first selection gate line SG11, the second selection gate line SG21, and the plate line PL1 with the channel region 7a. At an eleventh time T11, when the voltage of the bit lines BL0 to BL2 and the voltage of the source line SL1 drop to the first voltage V1, the PN junction of the bit line BL and the source line SL with the channel region 7a is forward biased. Then, as illustrated in FIG. 6I, the hole group 10 in the channel region 7a is discharged to the bit lines BL0 and BL2 and the source line SL1 of the memory cells C01 and C21 in the "1" written state.

At a twelfth time T12 in FIG. 6J, the voltage of the bit lines BL0 to BL2 and the voltage of the source line SL1 rise to the eleventh voltage V11 and the twelfth voltage V12, respectively. This rise is a measure for preventing the formation of an inversion layer in the channel region 7a as the voltage of the first selection gate line SG11, the second selection gate line SG21, and the plate line PL1 is reduced. Then, at a thirteen time T13, the voltage of the first selection gate line SG11 and the second selection gate line SG21 drops from the ninth voltage V9 to the first voltage V1, and the voltage of the plate line PL1 drops from the tenth voltage V10 to the third voltage V3. With this voltage drop, the voltage of the channel region 7a, which is a floating body, is lowered by capacitive coupling with the channel region 7a. Furthermore, at a fourteenth time T14, the voltage of the bit lines BL0 to BL2 and the voltage of the source line SL1 drop respectively from the eleventh voltage V11 and the twelfth voltage V12 to the first voltage V1. Also with this voltage drop, the voltage of the channel region 7a, which is a floating body, is further lowered by capacitive coupling with the channel region 7a. In this way, a page erase operation that discharges the hole group 10 in the channel region 7a without applying a negative voltage to the bit lines BL and the source line SL is possible.

As described above, the page erase operation is composed of two main operations. A first operation (which is an example of a "first operation" in the claims) is an operation in which, after increasing the voltage of the floating body of the channel region 7a by capacitive coupling due to an increase in the voltage of the first and second selection gate lines SG1 and SG2 and the plate line PL, the voltage of the bit lines BL and the source line SL is lowered to forward bias the PN junction, thereby discharging the hole group 10. A second operation (which is an example of a "second operation" in the claims) is a voltage lowering operation by capacitance coupling with the channel region 7a as the voltage of the first and second selection gate lines SG1 and SG2 and the plate line PL is reduced. Since no negative voltage is applied to the bit lines BL and the source line SL, it is not necessary to make the memory cell block a double-well structure having P well and N well. In addition, there is no need to input a negative voltage to each peripheral circuit, which not only simplifies the circuit design, but also greatly reduces the layout area and power of the circuit, which is of great advantage.

Figure 6K:
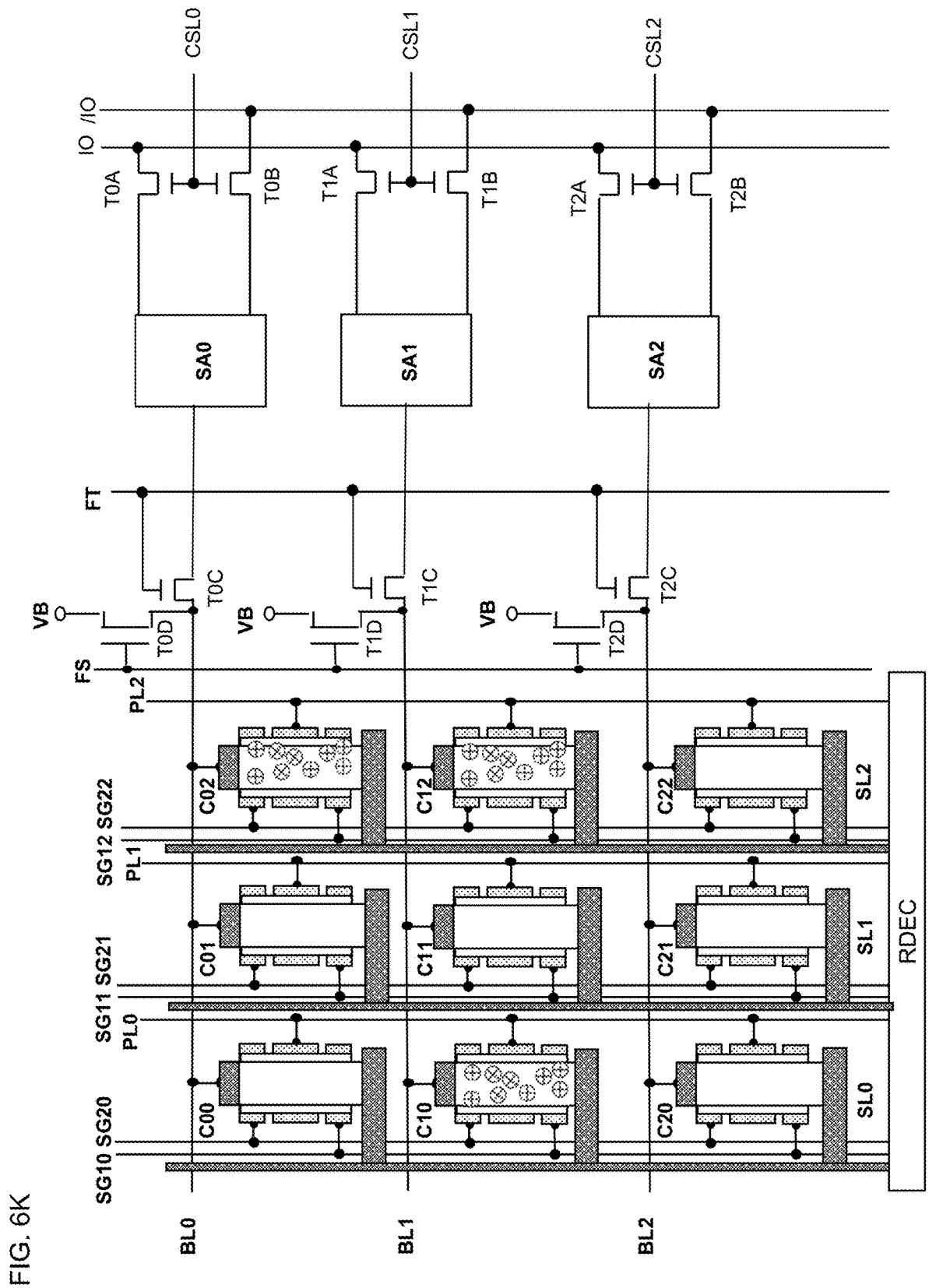
FIG. 6K is a circuit block diagram for describing the operation of setting the plate line of the unselected page of the memory device with SGT according to the first embodiment to a voltage of zero volts or less.

FIG. 6K illustrates that a page erase operation is performed, and there is no hole group 10 in the channel region 7a of the memory cells C01, C11, and C21. Even if the page erase operation ends at the fourteenth time T14, the "1"-written data is stored in the other memory cells, such as C10, C02, and C12. Therefore, the first voltage V1 is applied to all the first and second selection gate lines SG10 to SG22. Here, the first voltage V1 is, for example, 0 V, which is the ground voltage Vss. In addition, the third voltage V3, which is a negative voltage, such as −0.7 V, is applied to the plate lines PL0 to PL2. In doing so, the hole group 10 accumulated in the channel region 7a of the memory cells of unselected pages is mainly present on the plate lines PL0 to PL2 side. As a result, re-coupling of holes and electrons at the PN junction between the bit line BL and the channel region 7a and between the source line SL and the channel region 7a is suppressed. In addition, by applying a negative voltage to the plate lines PL0 to PL2, there is no inversion layer in the channel region 7a.

Figure 6L:
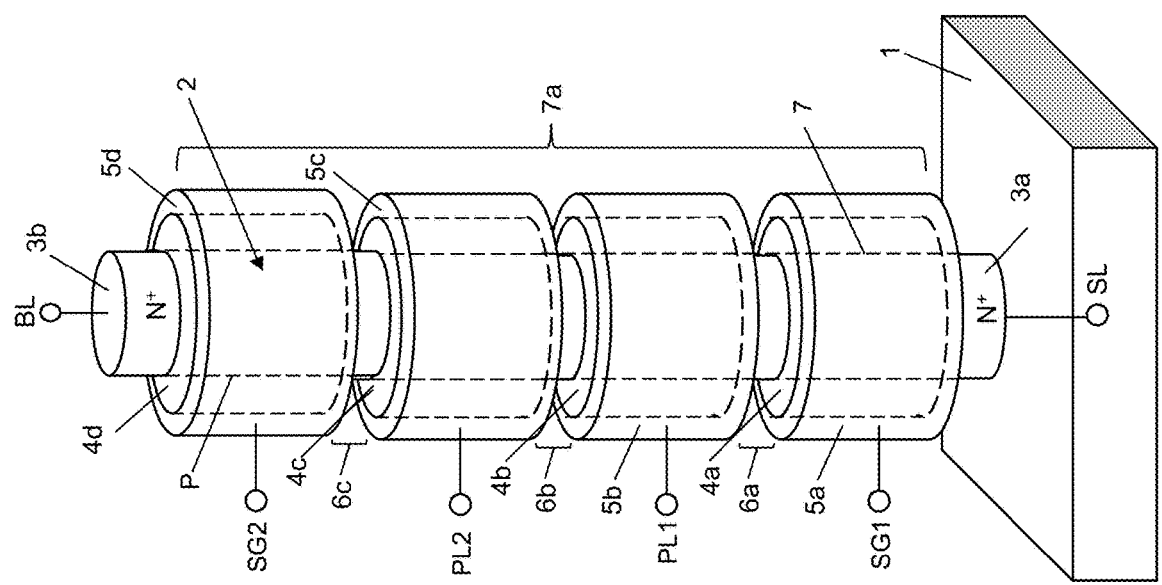
FIG. 6L is a structure diagram of the semiconductor memory device according to the first embodiment.
Figure 7B:
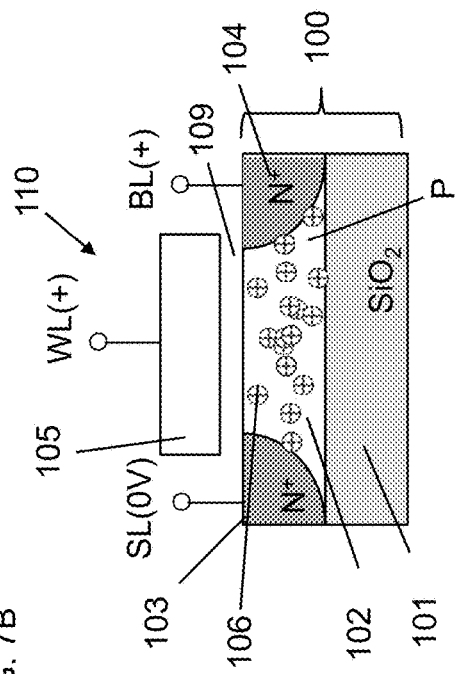
FIGS. 7A, 7B, 7C and 7D are diagrams for describing a write operation of a DRAM memory cell having no capacitor according to a conventional example.
Figure 7A:
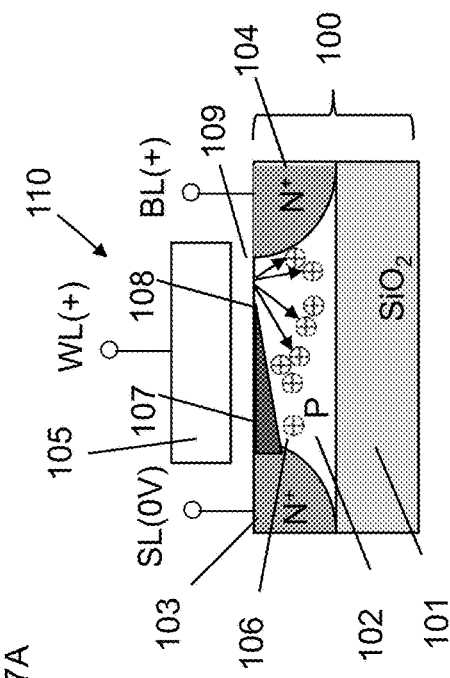
Figure 7D:
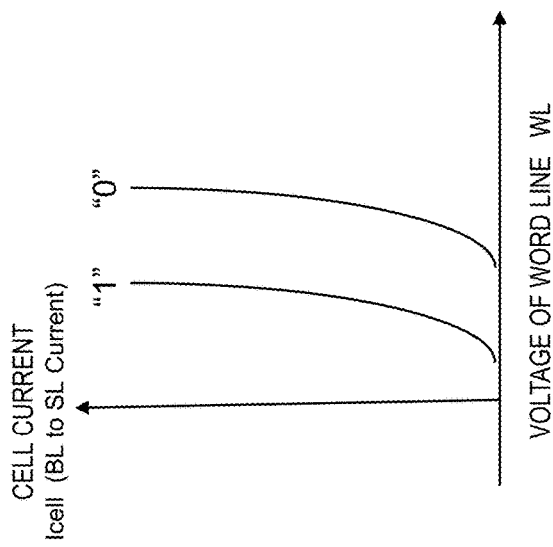
Figure 7C:
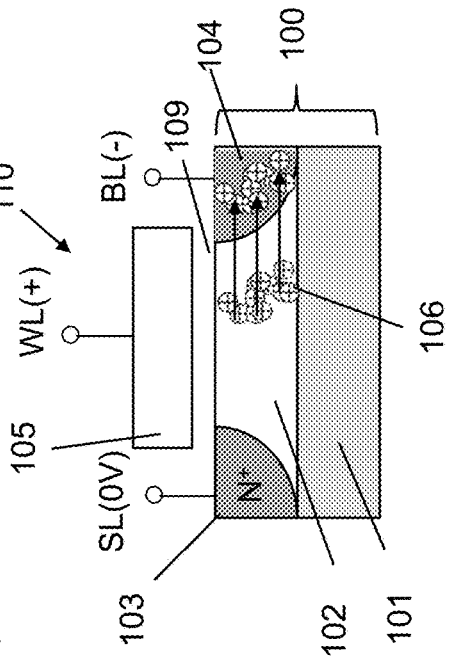
Figure 8A:
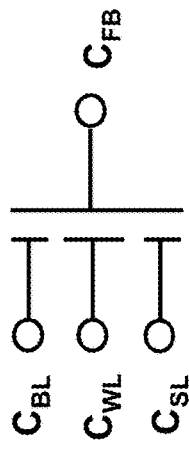
FIGS. 8A and 8B are diagrams for describing an operational problem of the DRAM memory cell having no capacitor according to the conventional example.
Figure 8B:
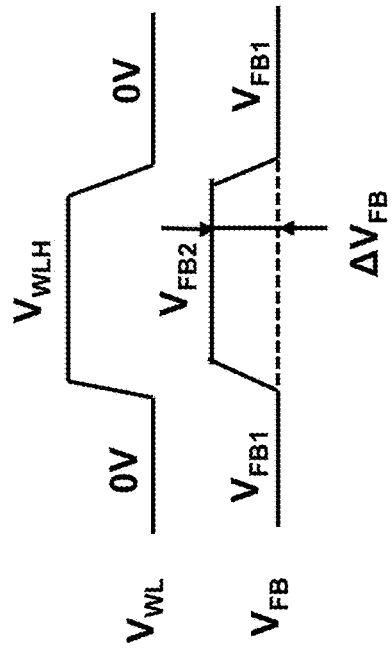
Figure 9C:
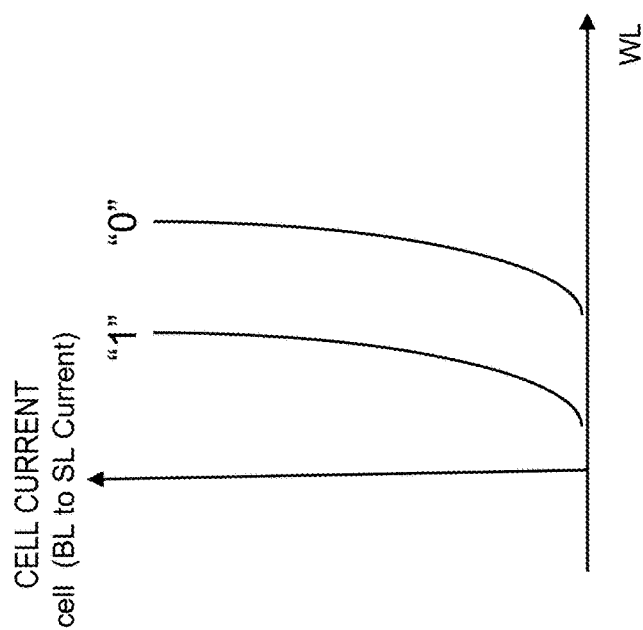
FIGS. 9A, 9B and 9C are diagrams for describing a read operation of the DRAM memory cell having no capacitor according to the conventional example.
Figure 9A:
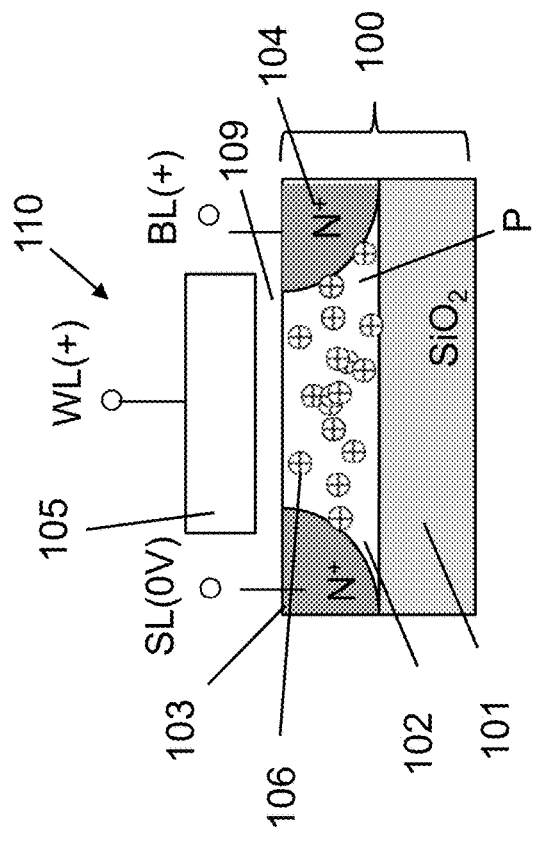
Figure 9B:
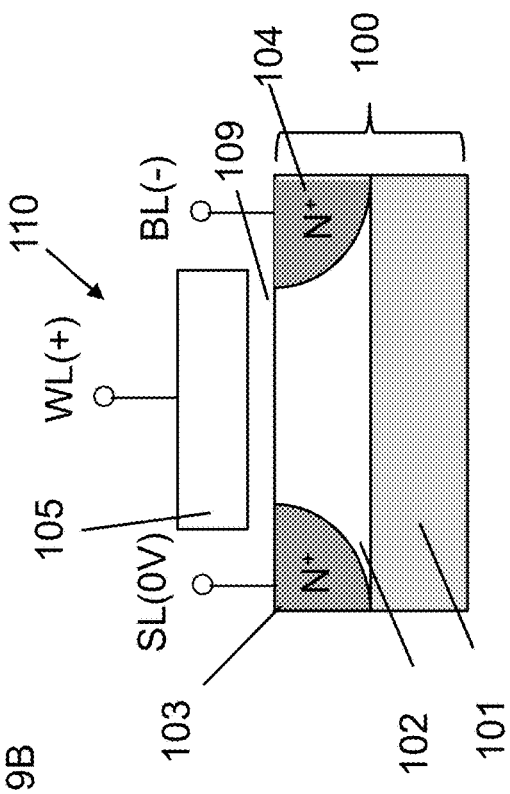
Figure 10:
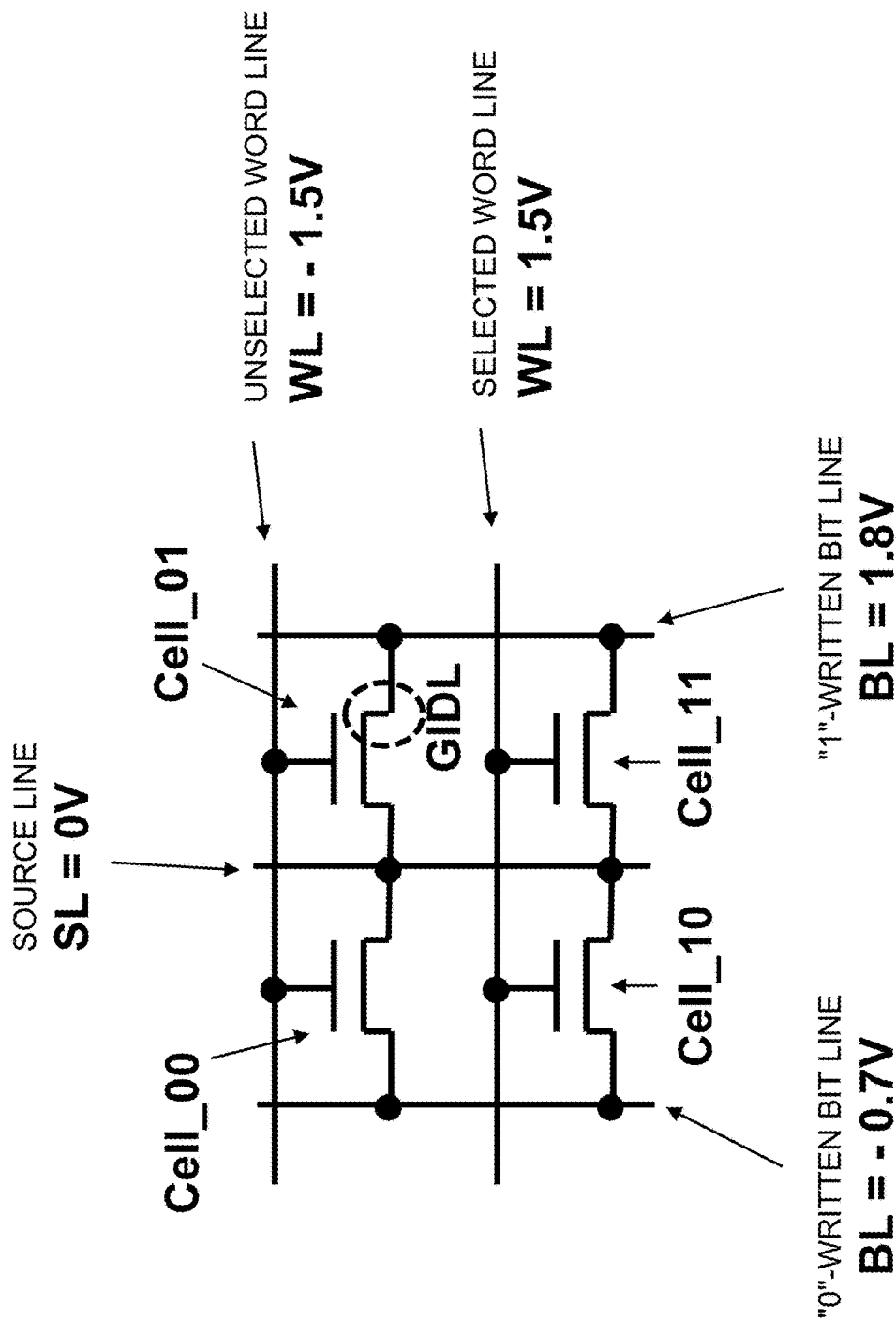
FIG. 10 is a diagram for describing a read operation of the DRAM memory cell having no capacitor according to the conventional example.

FIG. 6L is a structure diagram in which the plate line PL is composed of at least two plate lines PL1 and PL2. Even in the case of such a structure, the dynamic flash memory operation described in the present embodiment can be performed.

In FIG. 1, even if the horizontal cross-sectional shape of the Si column 2 is circular, elliptical, or rectangular, the dynamic flash memory operation described in the present embodiment can be performed. Additionally, dynamic flash memory cells with circular, elliptical, and rectangular horizontal cross-sectional shapes may be intermixed on the same chip.

In FIG. 1, the dynamic flash memory element has been illustrated using an SGT by way of example, which includes the first gate insulating layer 4a, the second gate insulating layer 4b, and the third gate insulating layer 4c surrounding the entire side surface of the Si column 2 standing vertically on the substrate 1, and the first gate conductor layer 5a, the second gate conductor layer 5b, and the third gate conductor layer 5c surrounding the entirety of the first gate insulating layer 4a, the second gate insulating layer 4b, and the third gate insulating layer 4c. As discussed in the description of the present embodiment, the dynamic flash memory element may have any structure as long as it satisfies the condition that the hole group 10 generated by impact ionization is retained in the channel region 7a. To this end, the channel region 7a may have a floating body structure isolated from the substrate 1. Accordingly, even if the semiconductor base in the channel region is formed horizontally with respect to the substrate 1 using gate all around (GAA) technology (for example, see E. Yoshida and T. Tanaka (2003)), which is one type of SGT, and/or nanosheet technology (for example, see J. Y. Song, W. Y. Choi, J. H. Park, J. D. Lee, and B-G. Park: "Design Optimization of Gate-All-Around (GAA) MOS-FETs," IEEE Trans. Electron Devices, Vol. 5, No. 3, pp. 186-191, May 2006), the above-mentioned dynamic flash memory operation can be performed. In addition, the dynamic flash memory element may have a device structure using silicon on insulator (SOI) (for example, see J. Wan et al., (2012); T. Ohsawa et al., (2002); T. Shino et al., (2006); and E. Yoshida and T. Tanaka (2003)). In this device structure, the bottom of the channel region is in contact with an insulating layer of the SOI substrate, and the other portion of the channel region is surrounded by a gate insulating layer and an element separation insulating layer. Even with this structure, the channel region has a floating body structure. As mentioned above, it is sufficient for the dynamic flash memory element provided by the present embodiment to satisfy the condition that the channel region has a floating body structure. Alternatively, even with a structure where a fin transistor (for example, see H. Jiang, N. Xu, B. Chen, L. Zengl, Y. He, G. Du, X. Liu, and X. Zhang: "Experimental investigation of self-heating effect (SHE) in multiple-fin SOI Fin FETs," Semicond. Sci. Technol. 29 (2014) 115021 (7 pp)) is formed on an SOI substrate, if the channel region has a floating body structure, the dynamic flash operation can be performed.

Moreover, equations (1) to (4) of the present specification and the drawings are expressions used to qualitatively describe the phenomenon, and the phenomenon is not limited by these equations.

Although the reset voltages of the first and second selection gate lines SG1 and SG2, the bit lines BL, and the source lines SL are described as Vss, the reset voltages may be set to different voltages.

In the operation waveform diagrams of FIGS. 6B and 6E, the voltages of the bit line BL, the first and second selection gate lines SG1 and SG2, and the plate lines PL are specifically stated, but any voltage conditions may be used as long as they allow a memory cell current to cause impact ionization in the channel region 7a to form the hole group 10.

In the present specification and the claims, the meaning of "cover" as in the case of "a gate insulating layer, a gate conductor layer, or the like covers a channel or the like" includes cases of being entirely surrounded as in SGT and GAA, cases of being surrounded with a portion left as in a fin transistor, and cases of overlapping on a planar thing as in a planar-type transistor.

In FIG. 1, the first gate conductor layer 5a surrounds the entire first gate insulating layer 4a. In contrast, the first gate conductor layer 5a may have a structure that surrounds a portion of the first gate insulating layer 4a in plan view. The first gate conductor layer 5a may be divided into at least two gate conductor layers and they may be operated as at least two plate line PL electrodes. Similarly, the second gate conductor layer 5b may be divided into two or more and they may be operated synchronously or asynchronously as conductive electrodes of the word line WL. In doing so, the dynamic flash memory operation can be performed. In the case where the first gate conductor layer 5a is divided into two or more, at least one of the divided first gate conductor layers plays the role of the first gate conductor layer 5a. Moreover, in the divided second gate conductor layer 5b, at least one of the divided second gate conductor layers plays the role of the second gate conductor layer 5b.

Although a refresh operation of one-bit dynamic flash memory cells each of which includes one semiconductor base has been described with reference to FIGS. 6A to 6K, the present invention is also effective for a refresh operation of one-bit high-speed dynamic flash memory cells each of which includes two semiconductor bases storing the complementary data "1" and "0".

Although a refresh operation in a single-layer memory array of one-bit dynamic flash memory cells each of which includes one semiconductor base has been described with reference to FIGS. 6A to 6K, the present invention is also effective for a multilayer memory array having multiple layers of one-bit dynamic flash memory cells each of which includes one semiconductor base.

The voltage conditions applied to the bit lines BL, the source lines SL, the first and second selection gate lines SG1 and SG2, and the plate lines PL described above, and the voltage of the floating body are examples of performing basic operations including erase operations, write operations, and read operations, and other voltage conditions may be applied as long as the basic operations of the present invention can be performed.

The present embodiment provides the following features.

Feature 1

The plate line PL of an unselected page of the dynamic flash memory cell according to the first embodiment of the present invention is set to a voltage of zero volts or less. The third voltage V3, which is a negative voltage, such as −0.7 V, is applied to all the plate lines PL. In doing so, the hole group 10 accumulated in the channel region 7a of memory cells of the unselected page is mainly present on the plate line PL side. As a result, re-coupling of holes and electrons at the PN junction between the bit line BL and the channel region 7a and between the source line SL and the channel region 7a is suppressed. In addition, by applying a negative voltage to the plate lines PL, no inversion layer is formed in the channel region 7a. This prevents the reduction of the hole group 10 serving as a signal. As a result, the characteristics of retaining the written "1" of the hole group 10 accumulated in the channel region 7a are significantly improved. T. Ohsawa et al., (2002) and Takashi Ohsawa (2006) describe the method for extending the characteristics of retaining the written "1" by setting an unselected word line WL to −1.5 V. However, it is also described that, because 1.8 V is applied to the bit line BL at the time of writing, a voltage of 3.3 V is applied between the gate and the drain, and in memory cells connected to the unselected word line WL, a gate-induced drain leakage current (GIDL current) causes the destruction of the stored data "0". In the present invention, even if a negative voltage is applied to an unselected plate line PL, the plate line PL is not directly in contact with the bit line BL. Moreover, 0 V is applied to the second selection gate line SG2 of an unselected page of the present invention, and, even when the bit line BL is set to, for example, 0.8 V at the time of writing, merely a voltage of 0.8 V is applied between the gate and the drain, and no gate-induced drain leakage current is generated. Therefore, a negative voltage can be applied to the plate line PL of an unselected page, and the characteristics of retaining the written "1" can be significantly extended, thereby providing a highly reliable memory device.

Feature 2

Focusing on the role of the second gate conductor layer 5b to which the plate line PL of the dynamic flash memory cell according to the first embodiment of the present invention is connected, when the dynamic flash memory cell performs a write operation and a read operation, the voltage of the first and second selection gate lines SG1 and SG2 swings up and down. At this time, the plate line PL plays the role of reducing the capacitive coupling ratio between the first and second selection gate lines SG1 and SG2 and the channel region 7a. As a result, the effect of a change in the voltage of the channel region 7a when the voltage of the word line WL swings up and down can be significantly suppressed. This can increase the threshold voltage difference of the SGT transistors of the first and second selection gate lines SG1 and SG2 indicating logic "0" and "1". This leads to an expansion of the operating margin of the dynamic flash memory cell.

OTHER EMBODIMENTS

Although a Si column is formed in the present invention, a semiconductor column made of a semiconductor material other than Si may be formed. The same applies to other embodiments according to the present invention.

In FIG. 1, the dynamic flash memory operation is also performed in a structure in which the polarity of each of the conductivity types of the N$^+$ layers 3a and 3b and the P-layer Si column 2 is reversed. In this case, the major carriers in the Si column 2, which is of N type, are electrons. Therefore, a group of electrons generated by impact ionization is accumulated in the channel region 7a, and the "1" state is set.

The present invention allows various embodiments and modifications to be made without departing from the broad spirit and scope of the present invention. Moreover, each of the above embodiments is intended to describe one example of the present invention, and is not intended to limit the scope of the present invention. The above examples and modifications can be arbitrarily combined. Furthermore, even if some of the elements of the above embodiments are removed as necessary, they are also within the scope of the technical idea of the present invention.

According to a memory device using a semiconductor element, which is according to the present invention, a dynamic flash memory which is a memory device using a high-density and high-performance SGT can be obtained.

What is claimed is:

1. A memory device using a semiconductor element in which a page is composed of a plurality of memory cells arrayed on a substrate in a row direction, and a plurality of pages are arrayed in a column direction to constitute a memory block, each memory cell included in each of the pages comprising:

a semiconductor base standing on a substrate in a vertical direction relative to the substrate or extending on a substrate in a horizontal direction relative to the substrate;

a first impurity layer and a second impurity layer disposed at two ends, respectively, of the semiconductor base;

a first gate insulating layer surrounding a side surface of the semiconductor base between the first impurity layer and the second impurity layer, the first gate insulating layer being in contact with or proximate to the first impurity layer;

a second gate insulating layer surrounding the side surface of the semiconductor base, and being connected to the first gate insulating layer;

a third gate insulating layer surrounding the side surface of the semiconductor base, being connected to the second gate insulating layer, and being in contact with or proximate to the second impurity layer;

a first gate conductor layer covering the first gate insulating layer;

a second gate conductor layer covering the second gate insulating layer;

a third gate conductor layer covering the third gate insulating layer; and a channel semiconductor layer of the semiconductor base covered with the first gate insulating layer, the second gate insulating layer, and the third gate insulating layer, wherein:

the first impurity layer of the memory cell is connected to a source line, the second impurity layer is connected to a bit line, the first gate conductor layer is connected to a first selection gate line, the second gate conductor layer is connected to a plate line, the third gate conductor layer is connected to a second selection gate line, and the bit line is connected to a sense amplifier circuit;

and the memory device executes:

an operation of controlling voltages applied to the first gate conductor layer, the second gate conductor layer, the third gate conductor layer, the first impurity layer, and the second impurity layer to form a hole group by impact ionization inside the channel semiconductor layer, and retaining the hole group;

a page write operation of setting a voltage of the channel semiconductor layer to a first data retention voltage that is higher than a voltage of one or both of the first impurity layer and the second impurity layer;

a page erase operation of controlling a voltage applied to the first impurity layer, the second impurity layer, the first gate conductor layer, the second gate conductor layer, and the third gate conductor layer to extract the hole group from one or both of the first impurity layer and the second impurity layer, and then setting the voltage of the channel semiconductor layer to a second data retention voltage that is lower than the first data retention voltage by capacitive coupling of the first gate conductor layer, the second gate conductor layer, and the third gate conductor layer with the channel semiconductor layer; and a page read operation of reading page data of a memory cell group selected in at least one page to the bit line, and a voltage of zero volts or less is applied to the plate line of the memory cell connected to an unselected page among the pages.

2. The memory device using the semiconductor element according to claim 1, wherein, during the page read operation, a ground voltage or higher voltage is applied to the plate line of the memory cell connected to a selected page.

3. The memory device using the semiconductor element according to claim 1, wherein, during the page read operation, a refresh operation of returning the voltage of the channel semiconductor layer of a selected page to the first data retention voltage by forming the hole group by the impact ionization inside the channel semiconductor layer of the selected page is executed.

4. The memory device using the semiconductor element according to claim 1, wherein, during the page write operation, a first N-channel metal-oxide-semiconductor (MOS) transistor region having the first gate conductor layer and a third N-channel MOS transistor region having the third gate conductor layer are operated in a linear range, and a second N-channel MOS transistor region having the second gate conductor layer is operated in a saturated range.

5. The memory device using the semiconductor element according to claim 1, wherein the page erase operation executes:

a first operation of, after increasing a voltage of the channel semiconductor layer by capacitive coupling of the first selection gate line, the second selection gate line, and the plate line with the channel semiconductor layer, reducing a voltage of the bit line and the source line to forward bias a PN junction of the first impurity layer and the second impurity layer with the channel semiconductor layer, thereby discharging the hole group; and a second operation of lowering the voltage of the channel semiconductor layer as a voltage of the first selection gate line, the second selection gate line, and the plate line is reduced by capacitive coupling of the first selection gate line, the second selection gate line, and the plate line with the channel semiconductor layer.

6. The memory device using the semiconductor element according to claim 1, wherein the first selection gate line and the second selection gate line are connected.

7. The memory device using the semiconductor element according to claim 1, wherein a total capacitance of a gate capacitance between the first gate conductor layer and the semiconductor base and a gate capacitance between the third gate conductor layer and the semiconductor base is smaller than a second gate capacitance between the second gate conductor layer and the semiconductor base.

8. The memory device using the semiconductor element according to claim 1, wherein the impact ionization occurs inside the channel semiconductor layer in the vicinity between the second gate conductor layer and the third gate conductor layer, and the hole group is retained inside the channel semiconductor layer.

9. The memory device using the semiconductor element according to claim 1, wherein, during a page-accumulated read operation in which at least two pages are multiple-selected, a ground voltage or higher voltage is applied to a selected plate line, and a negative voltage is applied to an unselected plate line.

10. The memory device using the semiconductor element according to claim 1, wherein a voltage higher than or equal to a voltage applied to the plate line is applied to the first selection gate line and the second selection gate line of the memory cell connected to an unselected page among the pages.

11. The memory device using the semiconductor element according to claim 1, wherein, in plan view, the first selection gate line, the second selection gate line, the plate line, and the source line are arranged in parallel and are arranged perpendicular to the bit line.

12. The memory device using the semiconductor element according to claim 1, wherein, in plan view, the first selection gate line, the second selection gate line, and the plate line are arranged in parallel and are arranged perpendicular to the source line and the bit line.

* * * * *